(12) United States Patent
Shin et al.

(10) Patent No.: US 9,237,628 B2
(45) Date of Patent: Jan. 12, 2016

(54) ORGANIC LIGHT EMITTING DISPLAY DEVICE

(71) Applicant: LG Display Co., Ltd., Yeongdeungpo-gu, Seoul (KR)

(72) Inventors: Minjae Shin, Seoul (KR); Hongsuk Kim, Busan (KR)

(73) Assignee: LG Display Co., Ltd., Seoul (KR)

( * ) Notice: Subject to any disclaimer, the term of this patent is extended or adjusted under 35 U.S.C. 154(b) by 404 days.

(21) Appl. No.: 13/707,128

(22) Filed: Dec. 6, 2012

(65) Prior Publication Data

US 2014/0111116 A1 Apr. 24, 2014

(30) Foreign Application Priority Data

Oct. 24, 2012 (KR) ........................ 10-2012-0118424

(51) Int. Cl.
| | | |
|---|---|---|
| H05B 37/00 | (2006.01) | |
| H05B 39/00 | (2006.01) | |
| H05B 41/00 | (2006.01) | |
| H05B 33/08 | (2006.01) | |
| H01L 27/32 | (2006.01) | |
| G09G 3/32 | (2006.01) | |

(52) U.S. Cl.
CPC ........ H05B 33/0896 (2013.01); H01L 27/3279 (2013.01); G09G 3/3225 (2013.01); *G09G 2300/0426* (2013.01); *G09G 2320/0223* (2013.01)

(58) Field of Classification Search
CPC ................... G09G 2300/0842; G09G 3/3233; G09G 2320/043; G09G 2300/0861; G09G 2300/0819
USPC ............................................. 345/76; 315/312
See application file for complete search history.

(56) References Cited

U.S. PATENT DOCUMENTS

| | | | | |
|---|---|---|---|---|
| 8,471,834 | B2 * | 6/2013 | Yamamoto et al. | ........... 345/204 |
| 2001/0043168 | A1 | 11/2001 | Koyama et al. | |
| 2003/0001171 | A1 * | 1/2003 | Banno et al. | ................. 257/207 |
| 2004/0149886 | A1 | 8/2004 | Matsueda et al. | |
| 2005/0285836 | A1 * | 12/2005 | Hwang et al. | ................... 345/93 |
| 2006/0017665 | A1 | 1/2006 | Ko et al. | |
| 2006/0077144 | A1 * | 4/2006 | Eom et al. | ....................... 345/82 |
| 2006/0187154 | A1 * | 8/2006 | Tsuchida | ........................ 345/76 |
| 2007/0134830 | A1 | 6/2007 | Park et al. | |
| 2008/0048948 | A1 | 2/2008 | Koh et al. | |
| 2008/0068524 | A1 * | 3/2008 | Kim | ............................... 349/38 |
| 2009/0184899 | A1 | 7/2009 | Kim et al. | |
| 2010/0090995 | A1 * | 4/2010 | Chung et al. | .................. 345/205 |
| 2011/0157114 | A1 | 6/2011 | Ko et al. | |
| 2012/0075268 | A1 * | 3/2012 | Chung et al. | .................. 345/204 |

FOREIGN PATENT DOCUMENTS

KR   10-2006-0047947 A   5/2006

* cited by examiner

*Primary Examiner* — Quan Tra
(74) *Attorney, Agent, or Firm* — Fenwick & West LLP

(57) ABSTRACT

Disclosed is an organic light emitting display device. The organic light emitting display device includes a display panel, a plurality of first flexible circuit films, a plurality of first driving ICs, a plurality of second flexible circuit films, and a plurality of second driving ICs. The display panel includes a plurality of pixels including a pixel circuit connected to a gate line, a data line, and a high-level voltage line. The first flexible circuit films are connected to a first pad part of the display panel, and supply a high-level voltage to the high-level voltage line. The second flexible circuit films are connected to a second pad part of the display panel, and supply the low-level voltage to a cathode electrode layer.

22 Claims, 12 Drawing Sheets

ORGANIC LIGHT EMITTING DISPLAY DEVICE

CROSS-REFERENCE TO RELATED APPLICATIONS

This application claims the benefit of the Korean Patent Application No. 10-2012-0118424 filed on Oct. 24, 2012, which is hereby incorporated by reference as if fully set forth herein.

BACKGROUND

1. Field of the Invention

The present invention relates to an organic light emitting display device, and more particularly, to an organic light emitting display device that minimizes non-uniform luminance due to the drop of a voltage caused by a line resistance, and facilitates the supply of a high-level voltage and a low-level voltage.

2. Discussion of the Related Art

With the advance of multimedia, the importance of flat panel display (FPD) devices is increasing recently. Therefore, various FPD devices such as liquid crystal display (LCD) devices, plasma display panel (PDP) devices, and organic light emitting display devices are being used practically. In such FPD devices, the organic light emitting display devices having a self-emission type have a fast response time, low power consumption, high resolution, and a large screen, and thus are attracting much attention as next-generation FPD devices.

Generally, as illustrated in FIG. 1, a related art organic light emitting display device includes a display panel 10, a plurality of gate drivers 20, a plurality of data drivers 30, a plurality of flexible circuit films 40 for supplying power, and a printed circuit board (PCB) 50.

The display panel 10 includes a first substrate 12 including a plurality of pixels P and a cathode electrode layer CE, and a second substrate 14 facing-coupled to the first substrate 12.

The plurality of pixels P are respectively formed in a plurality of pixel areas defined by intersections between a plurality of gate lines GL and a plurality of data lines DL that are formed on the first substrate 12 to intersect. Each of the pixels P includes a pixel circuit PC and an emission cell EL.

The pixel circuit PC is connected to a gate line GL, a data line DL, and a high-level voltage line PL. The pixel circuit PC supplies a data current, corresponding to a data signal supplied to the data line DL, to an emission cell EL in response to a gate signal supplied to the gate line GL. For example, the pixel circuit PC includes a switching transistor T1, a driving transistor T2, and a capacitor C.

The switching transistor T1 is switched on according to the gate signal supplied to the gate line GL, and supplies a data voltage, supplied from the data line DL, to the driving transistor T2. The driving transistor T2 is switched on with the data voltage supplied from the switching transistor T1, generates a data current corresponding to the data voltage, and supplies the data current to the emission cell EL. The capacitor C holds the data voltage supplied to the driving transistor T2, during one frame.

The emission cell EL includes an anode electrode (not shown) connected to the pixel circuit PC, and an organic layer (not shown) formed on the anode electrode and the cathode electrode layer CE. Here, the organic layer may be formed to have a structure of a hole transport layer/organic emission layer/electron transport layer or a structure of a hole injection layer/hole transport layer/organic emission layer/electron transport layer/electron injection layer. Furthermore, the organic layer may further include a function layer for enhancing the emission efficiency and/or service life of the organic emission layer.

The cathode electrode layer CE is formed to cover an entire area except an edge of the first substrate 12, and is connected to the emission cell EL of each pixel P. The cathode electrode layer CE receives a low-level voltage from the flexible circuit film 50 for supplying power.

A plurality of data pad parts, a plurality of gate pad parts, and a plurality of power supply pad parts are prepared in an inactive area of the first substrate 12.

Each of the data pad parts includes a plurality of data pads respectively connected to the data lines DL.

Each of the gate pad parts includes a plurality of gate pads respectively connected to the gate lines DL.

Each of the power supply pad parts includes a plurality of high-level power pads respectively connected to the high-level voltage lines PL, and a plurality of low-level power pads connected to the cathode electrode layer CE. Each of the power supply pad parts is disposed between adjacent data pad parts.

The second substrate 14 is formed of glass or metal in a plate shape, and facing-coupled to the first substrate 12, thereby protecting the emission cell EL of each pixel P (formed in the first substrate 12) from moisture, oxygen, etc. In this case, the second substrate 14 is adhered to an inactive area of the first substrate 12 by a sealing member (not shown) that is formed to surround an active area of the first substrate 12 including the plurality of pixels P.

Each of the gate drivers 20 is connected to a corresponding gate pad part among the gate pad parts formed in a left or right inactive area of the first substrate 12, and supplies the gate signal to a corresponding gate line GL through the gate pad of the corresponding gate pad part. To this end, each of the gate drivers 20 includes a gate flexible circuit film 22 adhered to a corresponding gate pad part, and a gate driving integrated circuit (IC) 24 that is mounted on the gate flexible circuit film 22, generates the gate signal, and supplies the gate signal to a corresponding gate line GL through the gate flexible circuit film 22 and a corresponding gate pad.

Each of the data drivers 30 is connected to a corresponding data pad part among the data pad parts formed in an upper inactive area of the first substrate 12, and supplies a data signal to a corresponding data line DL through the data pad of the corresponding data pad part. To this end, each of the data drivers 30 includes a data flexible circuit film 32 adhered to a corresponding data pad part, and a data driving IC 34 that is mounted on the data flexible circuit film 32, generates the data signal, and supplies the data signal to a corresponding data line DL through the data flexible circuit film 32 and a corresponding data pad.

Each of the flexible circuit films 40 for supplying power is connected to a corresponding power supply pad part among the power supply pad parts formed in the upper inactive area of the first substrate 12, and disposed between adjacent data pad parts. Each of the flexible circuit films 40 supplies a high-level voltage to a corresponding high-level voltage line PL through a high-level power pad of a corresponding power supply pad part, and supplies a low-level voltage to the cathode electrode layer CE through a low-level power pad of the corresponding power supply pad part.

The PCB 50 is connected to the data driver 30 and the flexible circuit films 40 for supplying power, supplies digital input data to the data driver 30, and supplies the high-level voltage and the low-level voltage to the flexible circuit films 40.

In the related art organic light emitting display device, since the high-level voltage and the low-level voltage are supplied through the power supply pad parts prepared at an upper side of the display panel 10, a voltage decreases progressively closer from an upper side to a lower side of the display panel 10 due to the drop of a voltage (IR drop) caused by a line resistance, causing non-uniform luminance.

Furthermore, as the related art organic light emitting display device becomes higher in resolution, when the display panel 10 has super high resolution, the number of data lines DL, the number of gate lines GL, and the number of high-level voltage lines PL increase by more than two times. Due to this reason, the power supply pad part cannot be disposed in a space between adjacent data drivers 30, and thus, it is impossible to supply the high-level voltage and the low-level voltage through the flexible circuit film 40.

The above-described background is possessed by the inventors of the application for deriving the invention, or is technology information that has been acquired in deriving the invention. The above-described background is not necessarily known technology disclosed to the general public before the application of the invention.

SUMMARY

Accordingly, the present invention is directed to an organic light emitting display device that substantially obviates one or more problems due to limitations and disadvantages of the related art.

An aspect of the present invention is directed to an organic light emitting display device that minimizes non-uniform luminance due to the drop of a voltage caused by a line resistance, and facilitates the supply of a high-level supply voltage and a low-level supply voltage.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device, comprising: a display panel including a plurality of pixel driving lines configured to carry pixel driving signals; a plurality of supply voltage lines configured to carry a first supply voltage, each of the supply voltage lines having a first end and a second end; and a plurality of pixels connected to the supply voltage lines and the pixel driving lines, the pixels configured to emit light based on the first supply voltage and the pixel driving signals. The display device further comprises a plurality of first flexible circuit films configured to supply the first supply voltage to the first ends of the supply voltage lines; and a plurality of second flexible circuit films configured to supply the first supply voltage to the second ends of the supply voltage lines, wherein each of the first and second flexible circuit films is further configured to supply one or more of the pixel driving signals to the pixel driving lines.

The organic light emitting display device of may further comprise a plurality of first driving integrated circuits (ICs) mounted on the first flexible circuit films and a plurality of second driving (ICs) mounted on the second flexible circuit films, the first and second driving ICs generating the pixel driving signals.

In one embodiment, the pixel driving lines are gate lines, the pixel driving signals are gate signals, and each of the first and second flexible circuit films is further configured to supply one or more of the gate signals to the gate lines. In another embodiment, the pixel driving lines are data lines, the pixel driving signals are data signals, and each of the first and second flexible circuit films is further configured to supply one or more of the data signals to the data lines.

In one embodiment, the display panel may further comprise a cathode layer connected to the pixels and configured to carry a second supply voltage that is lower than the first supply voltage, and each of the first and second flexible circuit films is further configured to supply the second supply voltage to the cathode layer.

In one embodiment, the display panel further comprises cathode connection parts located at corner regions of the cathode layer, wherein at least a subset of the first flexible circuit films are configured to supply the second supply voltage to the cathode layer via the cathode connection parts.

In one embodiment, the display panel further comprises first cathode connection parts located between adjacent ones of the first flexible circuit films, wherein the first flexible circuit films are configured to supply the second supply voltage to the cathode layer via the first cathode connection parts. In one embodiment, the display panel further comprises second cathode connection parts located between adjacent ones of the first cathode connection parts, wherein the first flexible circuit films are configured to supply the second supply voltage to the cathode layer via the second cathode connection parts. The second cathode connection parts and the pixel driving lines are located on different layers of the display panel.

In one embodiment, the first flexible circuit films are located along a first edge of the display panel and the second flexible circuit films are located along a second edge of the display panel, and the display device further comprises a plurality of third flexible circuit films located along a third edge of the display panel; and plurality of fourth flexible circuit films located along a fourth edge of the display panel, wherein the third edge and fourth edges are different than the first and second edges, and the third and fourth flexible circuit films are configured to supply the second supply voltage to the cathode layer.

In one embodiment, the display panel further comprises a cathode layer connected to the pixels and configured to carry a second supply voltage that is lower than the first supply voltage, the first flexible circuit films are located along a first edge of the display panel, the second flexible circuit films are located along a second edge of the display panel, and the display device further comprises a plurality of third flexible circuit films located along a third edge of the display panel; and a plurality of fourth flexible circuit films located along a fourth edge of the display panel, wherein the third edge and fourth edges are different than the first and second edges, and the third and fourth flexible circuit films are configured to supply the second supply voltage to the cathode layer.

In one embodiment, the display panel further comprises cathode connection parts located between adjacent ones of the third flexible circuit films, wherein the third flexible circuit films are configured to supply the second supply voltage to the cathode layer via the cathode connection parts.

In one embodiment, display panel further comprises cathode connection parts located at corner regions of the cathode layer, wherein at least a subset of the third flexible circuit films are configured to supply the second supply voltage to the cathode layer via the cathode connection parts.

In one embodiment, the display device further comprises a first printed circuit board (PCB) coupled to the first flexible circuit films, the first PCB configured to supply the first supply voltage to the first flexible circuit films; and a second PCB coupled to the third flexible circuit films, the second PCB configured to supply the second supply voltage to the third flexible circuit films.

In one embodiment, the display device further comprises a PCB coupled to the first flexible circuit films, the PCB configured to supply the first supply voltage to the first flexible circuit films and to supply the second supply voltage to the third flexible circuit films via at least one of the first flexible circuit films.

In one embodiment, the first flexible circuit films are located along a first edge of the display panel and the second flexible circuit films are located along a second edge of the display panel that is opposite from the first edge.

In one embodiment, an organic light emitting display device includes: a display panel including a plurality of pixels that include a pixel circuit connected to a gate line, a data line, and a high-level voltage line, and an emission cell formed between an anode electrode connected to the pixel circuit and a cathode electrode layer receiving a low-level voltage; a plurality of first flexible circuit films connected to a first pad part of the display panel connected to the high-level voltage line, and supplying a high-level voltage to the high-level voltage line through the first pad part; a plurality of first driving ICs mounted on the first flexible circuit films, respectively; a plurality of second flexible circuit films connected to a second pad part of the display panel connected to the cathode electrode layer, and supplying the low-level voltage to the cathode electrode layer through the second pad part; and a plurality of second driving ICs mounted on the second flexible circuit films, respectively.

The first pad part may include a data pad connected to the data line, and a high-level voltage pad connected to the high-level voltage line, the high-level voltage line being parallel to the data line, and each of the first flexible circuit films may supply a data signal, outputted from a corresponding first driving IC, to the data pad, and supply the high-level voltage, supplied to a high-level voltage supply line connected to the high-level voltage pad, to the high-level voltage pad.

The second pad part may include a gate pad connected to the gate line, and a low-level voltage pad electrically connected to the cathode electrode layer, and each of the second flexible circuit films may supply a gate signal, outputted from a corresponding second driving IC, to the gate pad, and supply the low-level voltage, supplied to a low-level voltage supply line connected to the low-level voltage pad, to the low-level voltage pad.

The first pad part may further include a plurality of additional low-level voltage pad formed at both sides of the high-level voltage pad, and receiving the low-level voltage, and each of the first flexible circuit films may additionally supply the low-level voltage, supplied to an additional low-level voltage supply line connected to the additional low-level voltage pads, to the additional low-level voltage pads.

The first pad part may include a gate pad connected to the gate line, and a high-level voltage pad connected to the high-level voltage line, the high-level voltage line being parallel to the gate line, and each of the first flexible circuit films may supply a gate signal, outputted from a corresponding first driving IC, to the gate pad, and supply the high-level voltage, supplied to a high-level voltage supply line connected to the high-level voltage pad, to the high-level voltage pad.

The second pad part may include a data pad connected to the data line, and a low-level voltage pad electrically connected to the cathode electrode layer, and each of the second flexible circuit films may supply a data signal, outputted from a corresponding second driving IC, to the data pad, and supply the low-level voltage, supplied to a low-level voltage supply line connected to the low-level voltage pad, to the low-level voltage pad.

The first pad part may further include an additional low-level voltage pad receiving the low-level voltage, and each of the first flexible circuit films may additionally supply the low-level voltage, supplied to an additional low-level voltage supply line connected to the additional low-level voltage pad, to the additional low-level voltage pad.

The display panel may further include a plurality of cathode connection parts supplying the low-level voltage, supplied from the respective second flexible circuit films to the low-level voltage pad, to the cathode electrode layer. Each of the cathode connection parts may include: a low-level voltage electrode connected to the low-level voltage pad to overlap an edge portion of the cathode electrode layer; and a cathode contact hole electrically connecting the edge portion of the cathode electrode layer and the low-level voltage electrode.

The display panel may further include a plurality of additional cathode connection parts supplying the low-level voltage, supplied from the respective first flexible circuit films to the additional low-level voltage pad, to the cathode electrode layer. Each of the additional cathode connection parts may include: an additional low-level voltage electrode connected to the additional low-level voltage pad to overlap an edge portion of the cathode electrode layer; and an additional cathode contact hole electrically connecting the edge portion of the cathode electrode layer and the additional low-level voltage electrode.

The organic light emitting display device may further include: a first PCB supplying the high-level voltage to the first flexible circuit films; and a second PCB supplying the low-level voltage to the second flexible circuit films.

The organic light emitting display device may further include: a first PCB supplying the high-level voltage and the low-level voltage to the first flexible circuit films; and a second PCB supplying the low-level voltage to the second flexible circuit films.

The organic light emitting display device may further include a PCB connected to the first flexible circuit films, and supplying the high-level voltage to the first flexible circuit films and supplying the low-level voltage to the second flexible circuit films through some of the first flexible circuit films and the display panel.

The organic light emitting display device may further include a PCB connected to the first flexible circuit films, and supplying the high-level voltage and the low-level voltage to the first flexible circuit films and supplying the low-level voltage to the second flexible circuit films through some of the first flexible circuit films and the display panel.

The organic light emitting display device may further include a PCB connected to the second flexible circuit films, and supplying the low-level voltage to the second flexible circuit films and supplying the high-level voltage to the first flexible circuit films through some of the second flexible circuit films and the display panel.

The organic light emitting display device may further include a PCB connected to the second flexible circuit films, and supplying the low-level voltage to the second flexible circuit films and supplying the high-level voltage and the low-level voltage to the first flexible circuit films through some of the second flexible circuit films and the display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 2:
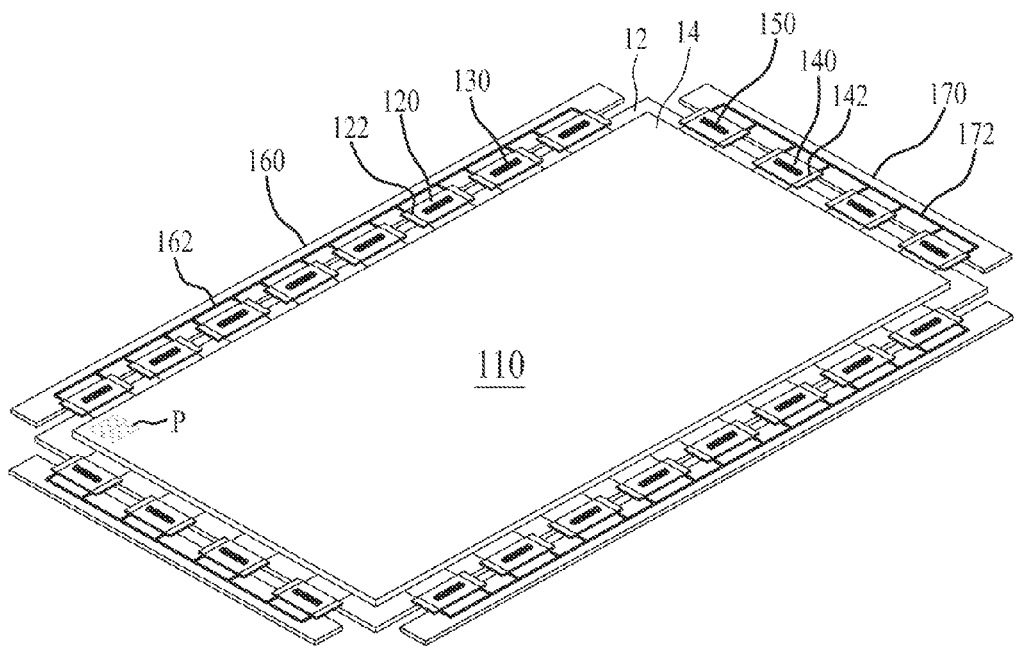
FIG. 2 is a perspective view schematically illustrating an organic light emitting display device according to a first embodiment of the present invention.
Figure 3:
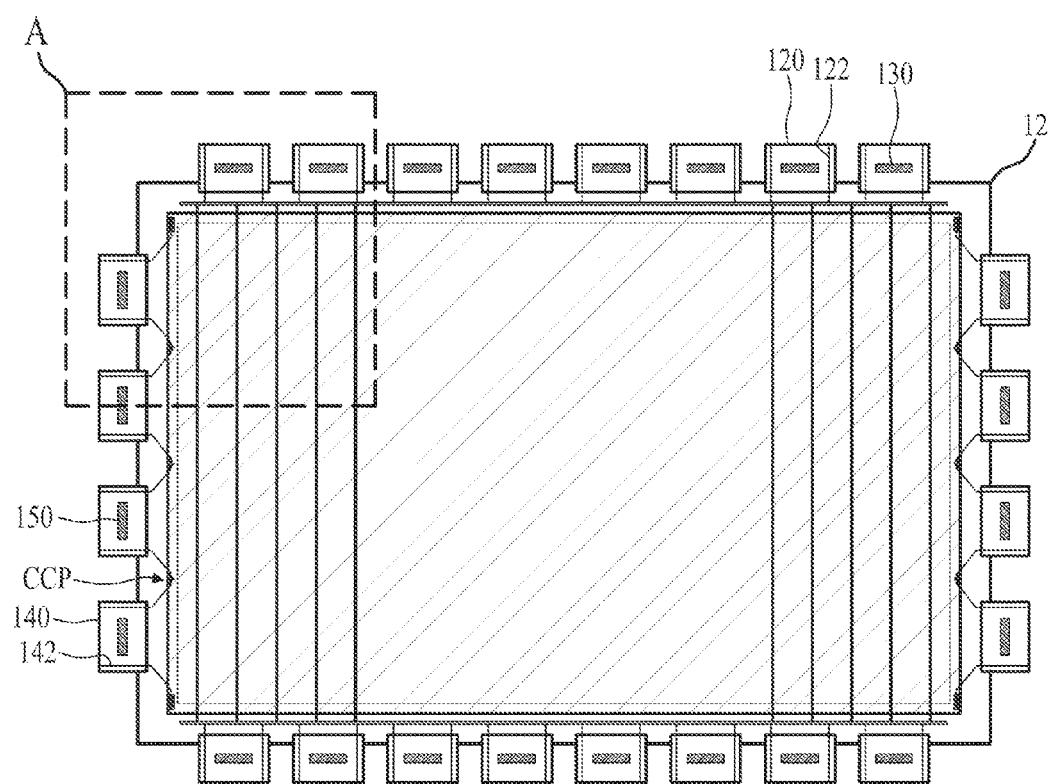
FIG. 3 is a plan view for describing a plurality of first and second flexible circuit films connected to a first substrate of FIG. 2.
Figure 4:
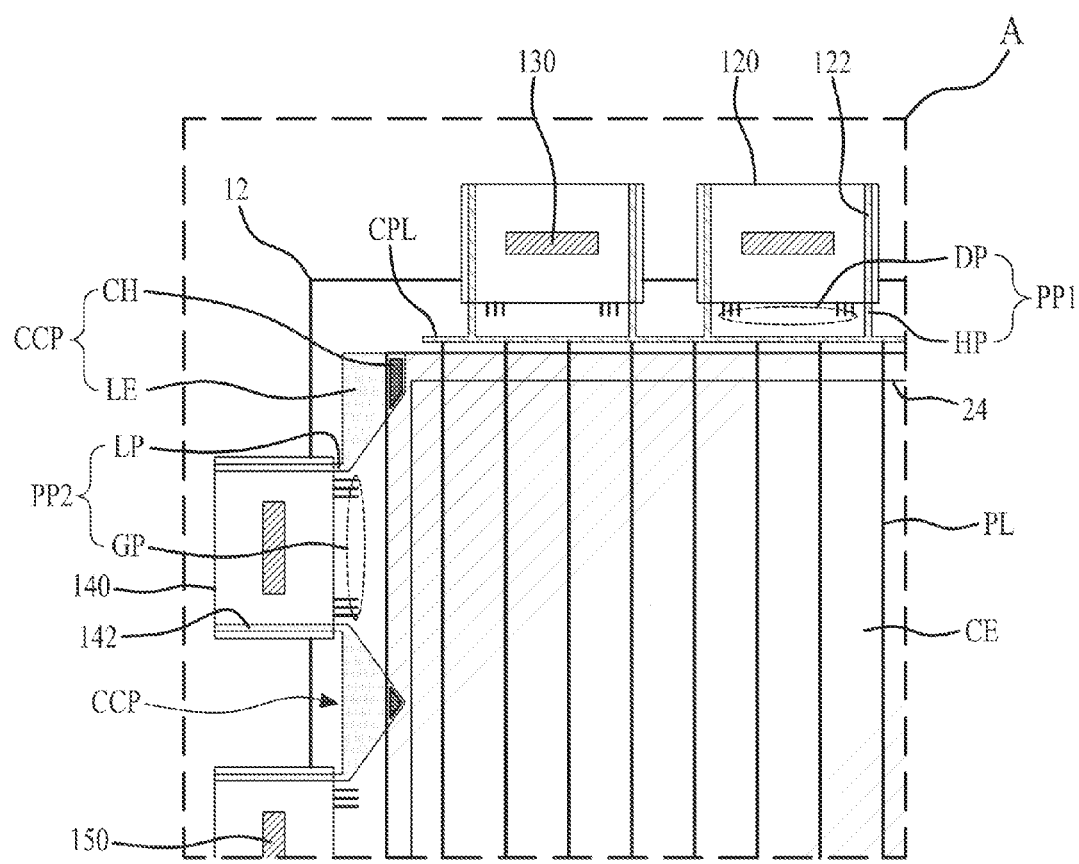
FIG. 4 is an enlarged view of a portion A of FIG. 3.

FIG. 2 is a perspective view schematically illustrating an organic light emitting display device according to a first embodiment of the present invention. FIG. 3 is a plan view for describing a plurality of first and second flexible circuit films connected to a first substrate of FIG. 2. FIG. 4 is an enlarged view of a portion A of FIG. 3.

Referring to FIGS. 2 to 4, the organic light emitting display device according to the first embodiment of the present invention includes a display panel 110, a plurality of first flexible circuit films 120, a plurality of first driving ICs 130, a plurality of second flexible circuit films 140, and a plurality of second driving ICs 150.

The display panel 110 includes a first substrate 12 including a plurality of pixels P and a cathode electrode layer CE, and a second substrate 14 facing-coupled to the first substrate 12.

Figure 1:
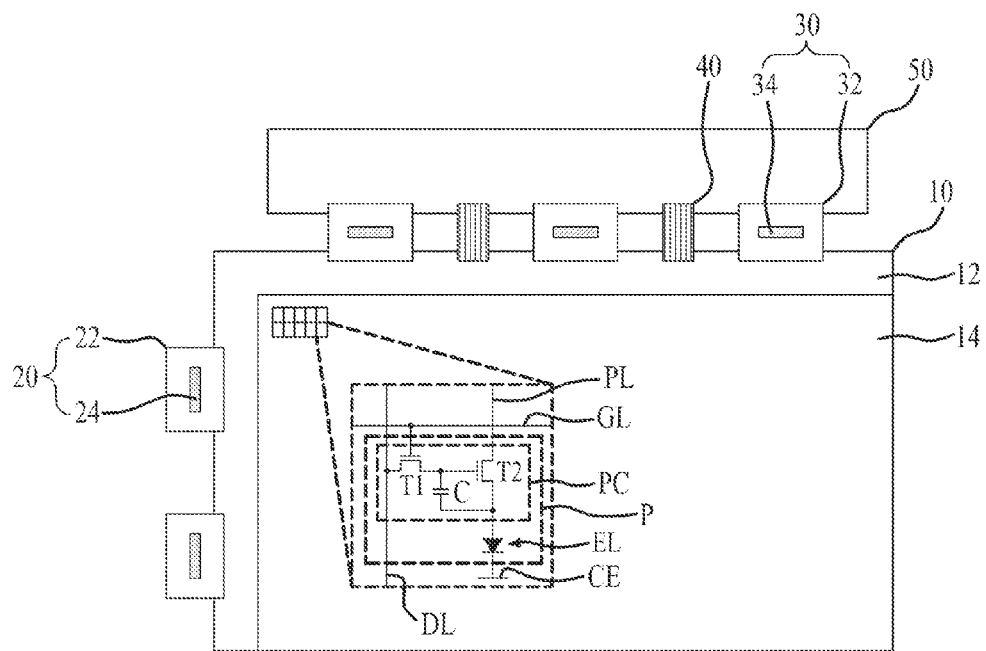
FIG. 1 is a view schematically illustrating a related art organic light emitting display device.

The plurality of pixels P are respectively formed in a plurality of pixel areas defined by intersections between a plurality of gate lines and a plurality of data lines that are formed on the first substrate 12 to intersect. Each of the pixels P, as illustrated in FIG. 1, includes a pixel circuit PC and an emission cell EL.

The pixel circuit PC is connected to a gate line GL, a data line DL, and connected to a high-level voltage line PL adjacent to and parallel to the data line DL. The pixel circuit PC supplies a data current, corresponding to a data voltage signal supplied to the data line DL, to an emission cell EL in response to a gate signal supplied to the gate line GL. As used herein, a pixel driving line may refer to either a gate line GL, data line DL, or any similar lines that carry pixel driving signals to control light emitted by the pixels.

The pixel circuit PC according to an embodiment includes a switching transistor T1, a driving transistor T2, and a capacitor C.

The switching transistor T1 is switched on according to the gate signal supplied to the gate line GL, and supplies a data voltage signal, supplied from the data line DL, to the driving transistor T2. The driving transistor T2 is switched on with the data voltage signal supplied from the switching transistor T1, generates a data current corresponding to the data voltage signal, and supplies the data current to the emission cell EL with a high-level voltage (a high-level power supply voltage, such as VDD) supplied to the high-level supply voltage line PL. The data current causes the emission cell EL to emit light. The capacitor C holds the data voltage supplied to the driving transistor T2, during one frame.

In the pixel circuit PC of each pixel P, a threshold voltage deviation of the driving transistor T1 occurs with a driving time of the driving transistor T2, causing the degradation of image quality. Therefore, the pixel circuit PC according to another embodiment may further include a compensation circuit (not shown) for compensating for the threshold voltage of the driving transistor T2.

The compensation circuit includes at least one compensation transistor (not shown) and at least one compensation capacitor (not shown) that are formed inside the pixel circuit PC. The compensation circuit stores both a data voltage and the threshold voltage of the driving transistor T1 in the capacitor during a detection period for which the threshold voltage of the driving transistor T2 is detected, thereby compensating for the threshold voltage of the driving transistor T2.

The emission cell EL includes an anode electrode (not shown) connected to the pixel circuit PC, and an organic layer (not shown) formed on the anode electrode and the cathode electrode layer CE. Here, the organic layer may be formed to have a structure of a hole transport layer/organic emission layer/electron transport layer or a structure of a hole injection layer/hole transport layer/organic emission layer/electron transport layer/electron injection layer. Furthermore, the organic layer may further include a function layer for enhancing the emission efficiency and/or service life of the organic emission layer.

The cathode electrode layer CE, shaded with diagonal lines in FIGS. 3 and 4, is formed to cover an entire area of the first substrate 12 except for an edge of the first substrate 12. The cathode electrode layer CE is also connected to the emission cell EL of each pixel P. The cathode electrode layer CE receives a low-level voltage (a low-level power supply voltage, such as VSS) from the second flexible circuit film 140. The low-level power supply voltage has a lower voltage than the high-level power supply voltage.

A plurality of first pad parts PP1, a plurality of cathode connection parts CCP, and a plurality of second pad parts PP2 are prepared in an inactive area of the first substrate 12.

Each of the first pad parts PP1 includes a plurality of data pads DP respectively connected to the data lines DL (not shown), and a plurality of high-level voltage pads HP respectively connected to the high-level voltage lines PL. Each of the first pad parts PP1 is prepared in the display panel 110, namely, in first and second inactive areas of the first substrate 12 which are parallel to each other. For example, the first inactive area is an upper edge area of the first substrate 12, and the second inactive area is a lower edge area of the first substrate 12. Each high voltage line PL extends across the display panel 110 from the upper edge area to the lower edge area. One end of each high voltage line PL is located in the upper edge area and the opposite end of the high voltage line PL is located in the lower edge area. Each of the data pads DP is connected to a corresponding data line DL through a corresponding data link line among a plurality of data link lines (not shown).

Each of the high-level voltage pads HP is electrically connected to a common high-level voltage line CPL that is connected in common to the high-level voltage lines PL. Therefore, the high-level voltage lines PL are formed to be adjacent to and parallel to the respective data lines DL (not shown), and receive a high-level voltage from the respective first flexible circuit films 120 through the common high-level voltage line CPL and the high-level voltage pad HP.

Each of the cathode connection parts CCP includes a low-level voltage electrode LE that partially overlaps the cathode electrode layer CE, and a cathode contact hole CH.

The low-level voltage electrode LE is formed in the display panel 110, namely, in third and fourth inactive areas of the first substrate 12 to be disposed at both sides of each of the second flexible circuit films 140, and a portion of the low-level voltage electrode LE overlaps an edge portion of the cathode electrode layer CE.

The cathode contact hole CH is formed in an overlap area of the low-level voltage electrode LE and the cathode electrode layer CE, thereby enabling the cathode electrode layer CE to be electrically connected to the low-level voltage electrode LE. That is, the cathode contact hole CH is formed by an etching process that removes a portion of a thin film layer formed on the low-level voltage electrode LE and thus exposes a partial area of the low-level voltage electrode LE. Therefore, the cathode electrode layer CE is formed on the first substrate 12 including the cathode contact hole CH, and electrically connected to the low-level voltage electrode LE through the cathode contact hole CH.

Each of the second pad parts PP2 includes a plurality of gate pads GP respectively connected to the gate lines GL, and a plurality of low-level voltage pads LP. Each of the second pad parts PP2 is prepared in the display panel 110, namely, the third and fourth inactive areas of the first substrate 12 which are parallel to each other. For example, the third inactive area is a left edge area of the first substrate 12, and the fourth inactive area is a right edge area of the first substrate 12.

Each of the gate pads GP is connected to a corresponding gate line GL through a corresponding gate link line among a plurality of gate link lines (not shown). Here, in consideration of a formation area and resistivity, the low-level voltage electrode LE may be formed to have a flat plane having a polygonal shape such as a triangular shape. Alternatively, the low-voltage electrodes LE may be formed as line shapes that run across the substrate 12 parallel to the gate lines.

The low-level voltage pads LP are formed in parallel with the gate pad GP therebetween, and electrically connected to the respective low-level voltage electrodes LE of the cathode connection parts CCP. Therefore, the cathode connection parts CCP are electrically connected to an edge portion of a corresponding cathode electrode layer CE at certain intervals, and each cathode connection part CCP receives a low-level voltage from a corresponding second flexible circuit film 140 through a corresponding low-level voltage pad LP.

The second substrate 14 is formed of glass or metal in a plate shape, and facing-coupled to the first substrate 12, thereby protecting the emission cell EL of each pixel P (formed in the first substrate 12) from moisture, oxygen, etc. In this case, the second substrate 14 is adhered to an inactive area of the first substrate 12 by a sealing member (not shown) that is formed to surround an active area of the first substrate 12 including the plurality of pixels P.

Each of the first flexible circuit films 120 are adhered to the first pad part PP1 connected to the high-level supply voltage line PL. A first set of the flexible circuit films 120 is located at the top edge of the display panel 110 while a second set of the first flexible circuit films 120 are located at the bottom edge of the display panel 110. Because the first flexible circuit films 120 are located at both the top side and bottom edges of the display panel 110, they simultaneously supply the high-level voltage to both ends of the high-level voltage line PL through their respective first pad parts PP1. To this end, a plurality of high-level voltage supply lines 122 electrically connected to the high-level voltage pad HP of the first pad part PP1 are formed in the first flexible circuit films 120, respectively.

Each of the first flexible circuit films 120 is formed as a tape carrier package (TCP) or a chip on film (chip on flexible board, COF), and adhered to the first pad part PP1, formed in each of the first and second inactive areas of the display panel 110, by a tape automated bonding (TAB) process. Therefore, the first flexible circuit films 120 may be divided into a plurality of upper first flexible circuit films adhered to the respective pad parts PP1 in the first inactive area, and a plurality of lower first flexible circuit films adhered to the respective pad parts PP1 in the second inactive area.

The first flexible circuit films 120 supply the high-level voltage, supplied from the outside, to both ends of the high-level voltage line PL, thereby minimizing the drop of the high-level voltage caused by the resistance of the high-level voltage line PL.

The first driving ICs 130 are respectively mounted on the first flexible circuit films 120, and drive the respective pixel circuits PC. A first set of the driving ICs 130 are mounted on the first flexible circuit films 120 at the top edge of the display panel 110 and a second set of the first driving ICs 130 are mounted on the first flexible circuit films at the bottom edge of the display panel 110. Each of the first driving ICs 130 generates analog data signals with a data control signal, a plurality of reference gamma voltages, and digital input data inputted through a corresponding first flexible circuit film 120, and supplies the data signals to corresponding data lines DL through the corresponding first flexible film 120 and the data pads DP of the first pad part PP1. A plurality of data signal supply lines (not shown) that are formed between the high-level voltage supply lines 122 and electrically connected to the respective data pads DP are formed in each of the first flexible circuit films 120, and moreover, a plurality of signal input lines (not shown) that transfer external digital input data, the data control signal, and the reference gamma voltages to the first driving IC 130 are formed in each of the first flexible circuit films 120.

Each of the second flexible circuit films 140 is adhered to the second pad part PP2, and supplies the low-level voltage to the low-level voltage electrode LE of each of the cathode connection parts CCP through the second pad part PP2. To this end, a plurality of low-level voltage supply lines 142 electrically connected to the low-level voltage pad LP of the second pad part PP2 are formed in each of the second flexible circuit films 140.

Each of the second flexible circuit films 140 is formed as a tape carrier package (TCP) or a chip on film (COF), and adhered to the second pad part PP2. The second flexible circuit films 140 are formed in the third and fourth inactive areas of the display panel 110, by a tape automated bonding (TAB) process. A first set of the second flexible circuit films 140 is located at the left edge of the display panel 110 while a second set of the second flexible circuit films 140 is located at the right edge of the display panel 110. Therefore, the second flexible circuit films 140 may be divided into a first set of second flexible circuit films 140 adhered to the respective pad parts PP2 in the third inactive area, and a second set of second flexible circuit 140 films adhered to the respective pad parts PP2 in the fourth inactive area.

The second flexible circuit films 140 supply the low-level voltage, supplied from the outside, to both sides of the cathode electrode layer CE, thereby maintaining the constant level of the low-level voltage supplied to the cathode electrode layer CE. Some of the cathode connection parts CCP are located in corner regions of the cathode layer CE, either directly on or adjacent to the corners of the cathode layer CE. The remaining cathode connection parts CCP are located between adjacent second pad parts PP2. The second flexible circuit films 140 supply the low-level voltage to the cathode electrode layer CE through these cathode connection parts CCP.

The second driving ICs 150 are respectively mounted on the second flexible circuit films 140, and drive the respective pixel circuits PC. Each of the second driving ICs 150 generates the gate signal according to a gate control signal inputted through a corresponding second flexible circuit film 140, and sequentially supplies the gate signals to corresponding gate lines GL through the corresponding second flexible film 140 and the gate pads GP of the second pad part PP2. A plurality of gate signal supply lines (not shown) that are formed between the low-level voltage supply lines 142 and electrically connected to the respective gate pads GP are formed in each of the second flexible circuit films 140, and moreover, a plurality of signal input lines (not shown) that transfer an external gate control signal to the second driving IC 150 are formed in each of the second flexible circuit films 140.

The organic light emitting display device according to the first embodiment of the present invention further includes first and second PCBs 160 and 170.

The first PCB 160 is electrically connected to each of the first flexible circuit films 120 adhered to the respective first pad parts PP1 in the first and second inactive areas of the display panel 110, and supplies the high-level voltage to the first flexible circuit films 120. To this end, a high-level voltage input line 162 connected to the high-level flexible voltage supply line 122 formed in the first flexible circuit film 120 is formed in the first PCB 160.

The first PCB 160 supplies the external digital input data, the data control signal, and the reference gamma voltages to each of the first driving ICs 130.

The second PCB 170 is electrically connected to each of the second flexible circuit films 140 adhered to the respective second pad parts PP2 in the third and fourth inactive areas of the display panel 110, and supplies the low-level voltage to the second flexible circuit films 140. To this end, a low-level voltage input line 172 connected to the low-level voltage supply line 142 formed in the second flexible circuit film 140 is formed in the first PCB 170.

The organic light emitting display device according to the first embodiment of the present invention supplies the high-level voltage to both ends of the high-level voltage line PL connected to each pixel P through the first flexible circuit film 120 with the first driving IC 130 mounted thereon, and supplies the low-level voltage to both sides of the cathode electrode layer CE (which are in common connected to the emission cell EL of each pixel P) through the second flexible circuit film 140 with the second driving IC 150 mounted thereon, thus minimizing non-uniform luminance due to the drop of a voltage caused by the resistance of the high-level voltage line PL and facilitating the supply of the high-level voltage and low-level voltage.

Figure 5:
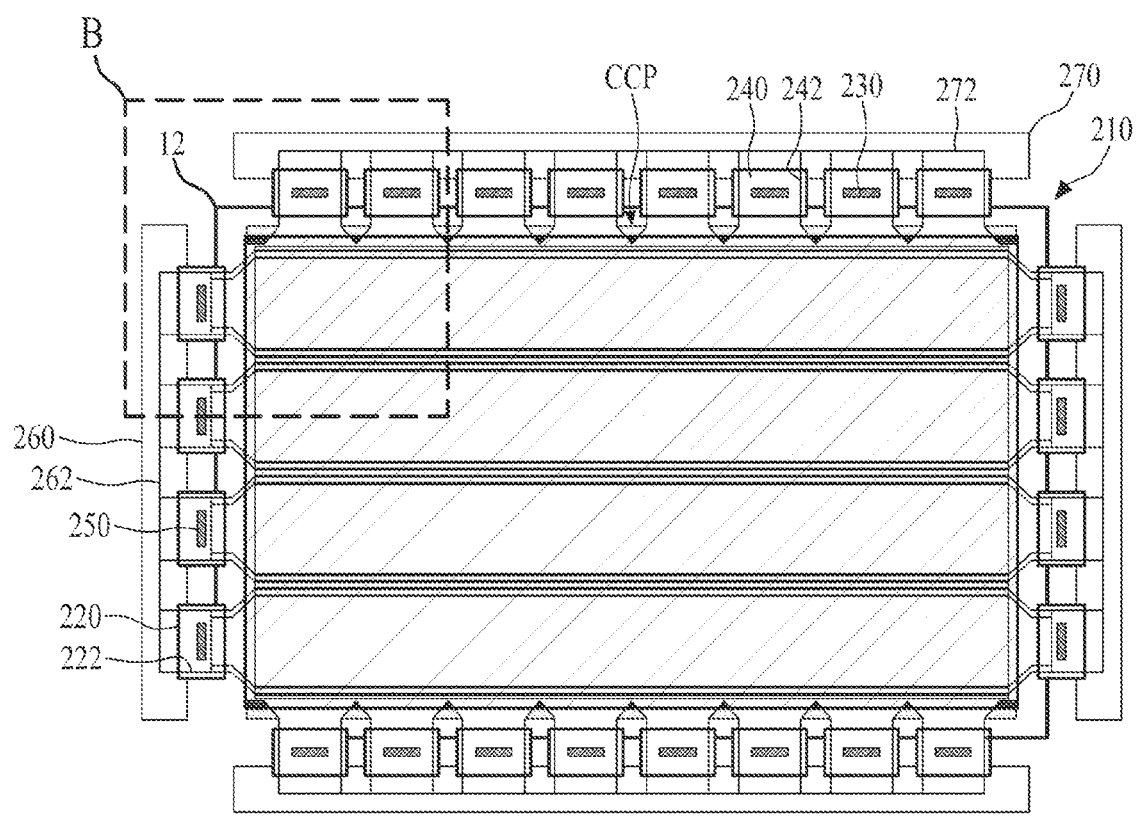
FIG. 5 is a perspective view schematically illustrating an organic light emitting display device according to a second embodiment of the present invention.
Figure 6:
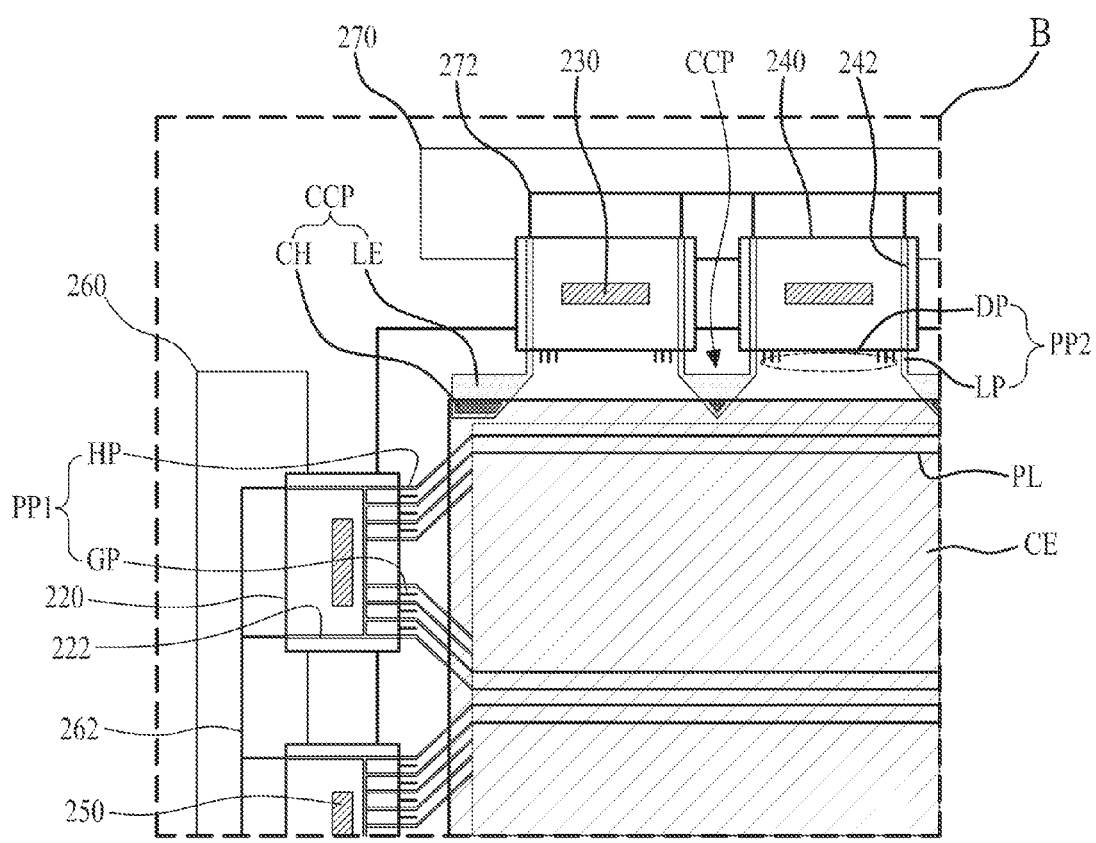
FIG. 6 is an enlarged view of a portion B of FIG. 5.

FIG. 5 is a perspective view schematically illustrating an organic light emitting display device according to a second embodiment of the present invention. FIG. 6 is an enlarged view of a portion B of FIG. 5. The display device of FIG. 5 is substantially similar to the display device of FIG. 3, but now the high-level voltage lines PL extend from the left edge to the right edge of the display panel 210 and are parallel with the gate lines (not shown) instead of the data lines (not shown). Additionally, the low-level voltage is provided to the cathode layer from the top and bottom of the display panel 210.

Referring to FIGS. 5 to 6, the organic light emitting display device according to the second embodiment of the present invention includes a display panel 210, a plurality of first flexible circuit films 220, a plurality of first driving ICs 230, a plurality of second flexible circuit films 240, and a plurality of second driving ICs 250.

The display panel 210 includes the first substrate 12 including the plurality of pixels P (see FIG. 2) and a cathode electrode layer CE, and the second substrate 14 (see FIG. 2) facing-coupled to the first substrate 12.

The plurality of pixels P are respectively formed in a plurality of pixel areas defined by intersections between a plurality of gate lines and a plurality of data lines that are formed on the first substrate 12 to intersect. Each of the pixels P, as illustrated in FIG. 1, includes a pixel circuit PC and an emission cell EL.

The pixel circuit PC is connected to a gate line GL, a data line DL, and connected to a high-level voltage line PL adjacent to and parallel to the gate line GL. The pixel circuit PC supplies a data current, corresponding to a data signal supplied to the data line DL, to an emission cell EL in response to a gate signal supplied to the gate line GL. Except for the high-level voltage lines PL being formed between adjacent gate lines GL and being parallel to a corresponding gate line GL, the pixel circuit PC and the emission cell EL are the same as the organic light emitting display device according to the first embodiment of the present invention, and thus, repetitive descriptions on these are not provided.

The cathode electrode layer CE is formed to cover an entire area except an edge of the first substrate 12, and connected to the emission cell EL of each pixel P. The cathode electrode layer CE receives a low-level voltage from the second flexible circuit film 240 for supplying power.

A plurality of first pad parts PP1, a plurality of second pad parts PP2, and a plurality of cathode connection parts CCP are prepared in an inactive area of the first substrate 12.

Each of the first pad parts PP1 includes a plurality of gate pads GP respectively connected to the gate lines GL, and a plurality of high-level voltage pads HP respectively connected to the high-level voltage lines PL. Each of the first pad parts PP1 is prepared in the display panel 210, namely, in third and fourth inactive areas of the first substrate 12 which are parallel to each other. For example, the third inactive area is a left edge area of the first substrate 12, and the fourth inactive area is a right edge area of the first substrate 12.

Each of the gate pads GP is connected to a corresponding gate line GL through a corresponding gate link line among a plurality of gate link lines (not shown).

Each of the high-level voltage pads HP is formed between adjacent gate pads GP, and electrically connected to the high-level voltage lines PL. Therefore, each of the high-level voltage lines PL is formed between adjacent gate lines GL to be parallel to the respective gate lines GL, and receives the high-level voltage from a corresponding first flexible circuit film 220 through a corresponding high-level voltage pad HP. In this case, one gate line GL or a predetermined number of gate lines GL may be formed between two adjacent high-level voltage lines PL.

Each of the second pad parts PP2 includes a plurality of data pads DP respectively connected to the data lines DL, and a plurality of low-level voltage pads LP. Each of the second pad parts PP2 is prepared in the display panel 210, namely, first and second inactive areas of the first substrate 12 which are parallel to each other. For example, the first inactive area is an upper edge area of the first substrate 12, and the second inactive area is a lower edge area of the first substrate 12.

Each of the data pads DP is connected to a corresponding data line DL through a corresponding data link line among a plurality of data link lines (not shown).

The low-level voltage pads LP are parallel with the data pads DP that are between the low voltage pads LP. The low-voltage pads are also electrically connected to the respective cathode connection parts CCP.

The cathode connection parts CCP are electrically connected to an upper edge portion and lower edge portion of the cathode electrode layer CE at certain intervals, and supply the low-level voltage, supplied from the respective second flexible circuit films 240 through the respective low-level voltage pads LP, to an upper edge portion and lower edge portion of the cathode electrode layer CE. To this end, each of the cathode connection parts CCP includes a low-level voltage electrode LE that partially overlaps the cathode electrode layer CE, and a cathode contact hole CH. The cathode connection parts CCP may be located at the corner regions of the cathode electrode layer CE or between adjacent second flexible circuit films 240.

The low-level voltage electrode LE is formed in the display panel 210, namely, in first and second inactive areas of the first substrate 12 to be disposed at both sides of each of the second flexible circuit films 240, and a portion of the low-level voltage electrode LE overlaps an edge portion of the cathode electrode layer CE. The low-level voltage electrode LE may be formed in a line shape and located between adjacent second pad parts PP2. However, in consideration of a formation area and resistivity, the low-level voltage electrode LE may be formed to have a flat plane having a polygonal shape such as a triangular shape.

The cathode contact hole CH is formed in an overlap area of the low-level voltage electrode LE and the cathode electrode layer CE, thereby enabling the cathode electrode layer CE to be electrically connected to the low-level voltage electrode LE. That is, the cathode contact hole CH is formed by removing a portion of a thin film layer formed on the low-level voltage electrode LE. Therefore, the cathode electrode layer CE is formed on the first substrate 12 including the cathode contact hole CH, and electrically connected to the low-level voltage electrode LE through the cathode contact hole CH.

The second substrate 14 is formed of glass or metal in a plate shape, and facing-coupled to the first substrate 12, thereby protecting the emission cell EL of each pixel P (formed in the first substrate 12) from moisture, oxygen, etc. In this case, the second substrate 14 is adhered to an inactive area of the first substrate 12 by a sealing member (not shown) that is formed to surround an active area of the first substrate 12 including the plurality of pixels P.

Each of the first flexible circuit films 220 is adhered to the first pad part PP1, and simultaneously supplies the high-level voltage to one side and the other side of the high-level voltage line PL through the first pad part PP1. To this end, a plurality of high-level voltage supply lines 222 electrically connected to the high-level voltage pad HP of the first pad part PP1 are formed in the first flexible circuit films 220, respectively. Each of the first flexible circuit films 220 is formed as a TCP or a COF, and adhered to the first pad part PP1, formed in each of the third and fourth inactive areas of the display panel 210, by the TAB process. Each of the first flexible circuit films 220 supplies the external high-level voltage to one side and the other side of the high-level voltage line PL, thereby minimizing the drop of the high-level voltage caused by the line resistance of the high-level voltage line PL.

Each of the second flexible circuit films 240 is adhered to the second pad part PP2, and supplies the low-level voltage to the low-level voltage electrode LE of each cathode connection part CCP through the second pad part PP2. To this end, a plurality of low-level voltage supply lines 242 electrically connected to the low-level voltage pad LP of the second pad part PP2 are formed in the second flexible circuit films 240, respectively. Each of the second flexible circuit films 240 is formed as a TCP or a COF, and adhered to the second pad part PP2, formed in each of the third and fourth inactive areas of the display panel 210, by the TAB process. Each of the second flexible circuit films 240 supplies the external high-level voltage to both sides of the cathode electrode layer CE, thereby maintaining the constant level of the low-level voltage supplied to the cathode electrode layer CE.

The first driving ICs 230 are respectively mounted on the second flexible circuit films 240, and drive the respective pixel circuits PC. Each of the first driving ICs 230 generates analog data signals with a data control signal, a plurality of reference gamma voltages, and digital input data inputted through a corresponding second flexible circuit film 240, and supplies the data signals to corresponding data lines DL through the corresponding second flexible film 240 and the data pads DP of the second pad part PP2. A plurality of data signal supply lines (not shown) that are formed between the low-level voltage supply lines 242 and electrically connected to the respective data pads DP are formed in each of the second flexible circuit films 240, and moreover, a plurality of signal input lines (not shown) that transfer external digital input data, the data control signal, and the reference gamma voltages to the first driving IC 230 are formed in each of the second flexible circuit films 240.

The second driving ICs 250 are respectively mounted on the first flexible circuit films 242, and drive the respective pixel circuits PC. Each of the second driving ICs 250 generates the gate signal according to a gate control signal inputted through a corresponding first flexible circuit film 220, and sequentially supplies the gate signals to corresponding gate lines GL through the corresponding first flexible film 220 and the gate pads GP of the first pad part PP1. A plurality of gate signal supply lines (not shown) that are formed between the high-level flexible voltage supply lines 222 and electrically connected to the respective gate pads GP are formed in each of the second flexible circuit films 240, and moreover, a plurality of signal input lines (not shown) that transfer an external gate control signal to the second driving IC 250 are formed in each of the first flexible circuit films 220.

The organic light emitting display device according to the second embodiment of the present invention further includes first and second PCBs 260 and 270.

The first PCB 260 is electrically connected to each of the first flexible circuit films 220 adhered to the respective first pad parts PP1 in the third and fourth inactive areas of the display panel 210, and supplies the high-level voltage to the first flexible circuit films 220. To this end, a high-level voltage input line 262 connected to the high-level flexible voltage supply line 222 formed in the first flexible circuit film 220 is formed in the first PCB 260.

The second PCB 270 is electrically connected to each of the second flexible circuit films 240 adhered to the respective second pad parts PP2 in the first and second inactive areas of the display panel 210, and supplies the low-level voltage to the second flexible circuit films 240. To this end, a low-level voltage input line 272 connected to the low-level voltage supply line 242 formed in the second flexible circuit film 240 is formed in the first PCB 270.

The second PCB 260 supplies the external digital input data, the data control signal, and the reference gamma voltages to each of the first driving ICs 230.

The organic light emitting display device according to the second embodiment of the present invention supplies the high-level voltage to both ends of the high-level voltage line PL (which is formed in parallel to the gate line GL of each pixel P) through the first flexible circuit film 220 with the second driving IC 250 mounted thereon, and supplies the low-level voltage to both sides of the cathode electrode layer CE (which are in common connected to the emission cell EL of each pixel P) through the second flexible circuit film 240 with the first driving IC 230 mounted thereon, thus minimizing non-uniform luminance due to the drop of a voltage caused by the resistance of the high-level voltage line PL and facilitating the supply of the high-level voltage and low-level voltage. Furthermore, in the organic light emitting display device according to the second embodiment of the present invention, the high-level voltage line PL is formed between adjacent gate lines GL, thus decreasing the number of high-level voltage lines PL to ⅓ compared to the organic light emitting display device according to the first embodiment of the present invention.

Figure 7:
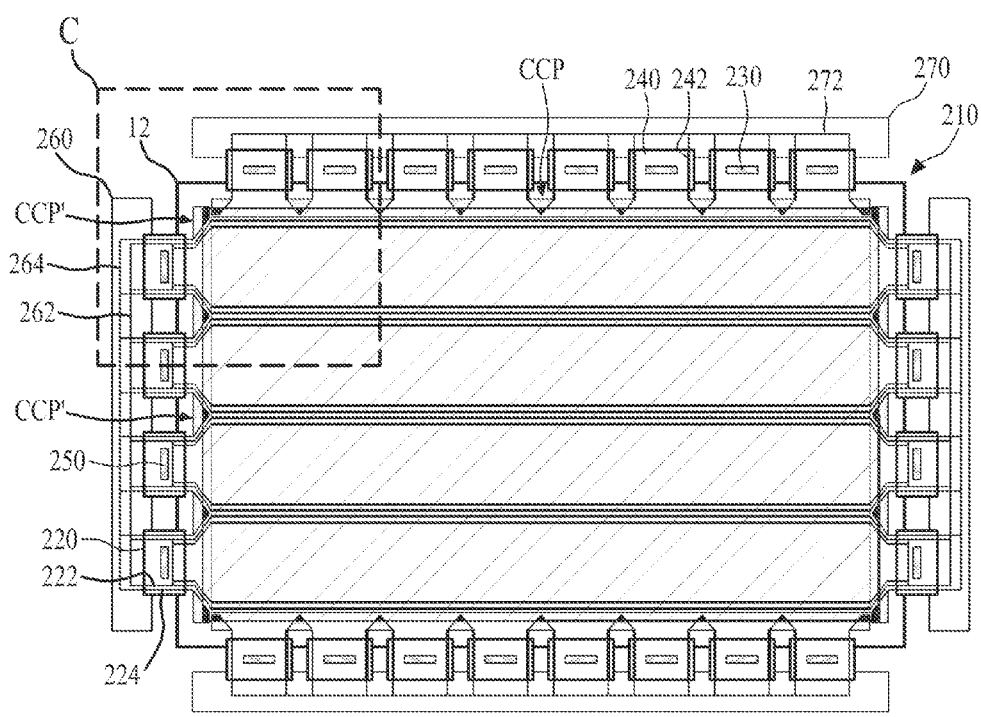
FIG. 7 is a perspective view schematically illustrating an organic light emitting display device according to a third embodiment of the present invention.
Figure 8:
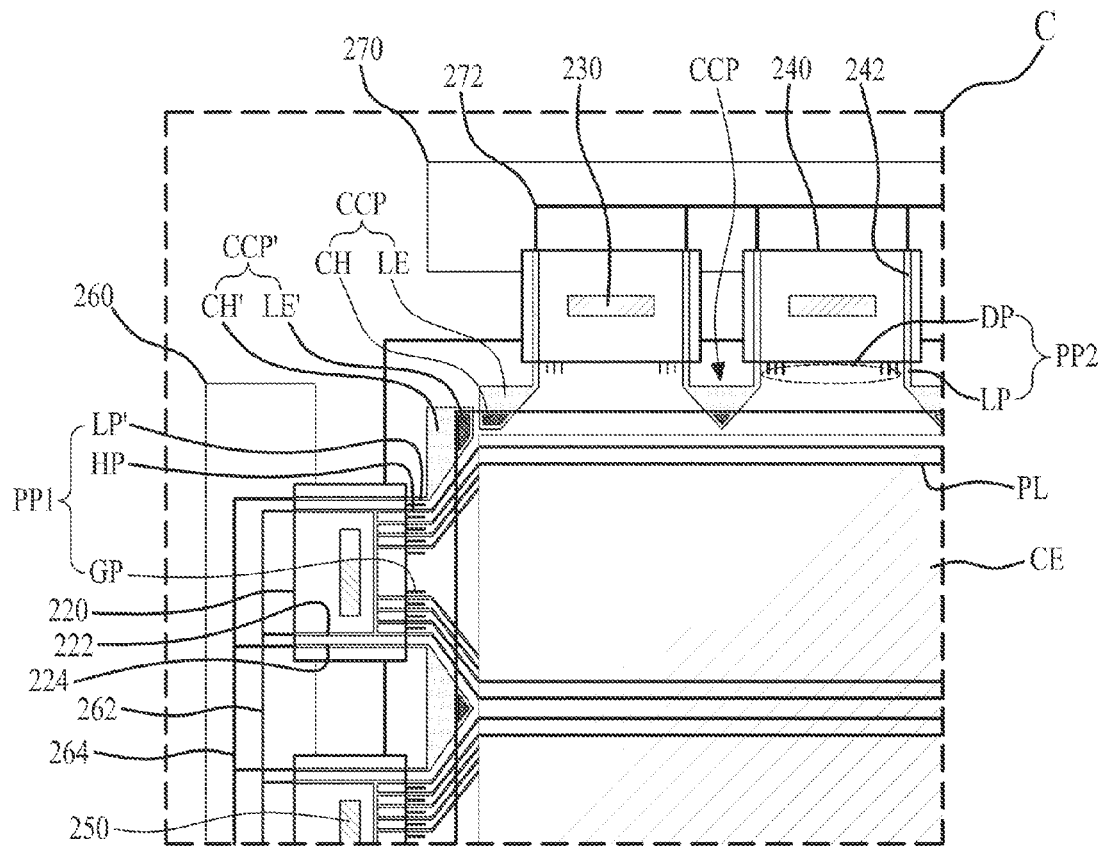
FIG. 8 is an enlarged view of a portion C of FIG. 7.

FIG. 7 is a perspective view schematically illustrating an organic light emitting display device according to a third embodiment of the present invention. FIG. 8 is an enlarged view of a portion C of FIG. 7. The display device of FIG. 7 is substantially similar to the display device of FIG. 3, but now the low-level voltage is also supplied from the first flexible circuit films 220 at the left and right edges of the display panel.

Referring to FIGS. 7 to 8, the organic light emitting display device according to the third embodiment of the present invention includes a display panel 210, a plurality of first flexible circuit films 220, a plurality of first driving ICs 230, a plurality of second flexible circuit films 240, and a plurality of second driving ICs 250. Except the first pad parts PP1 and the first flexible circuit films 220 prepared in the display panel 210, the other elements of the organic light emitting display device according to the third embodiment of the present invention are the same as the organic light emitting display device according to the second embodiment of the present invention, and thus, the above description is applied to the same elements.

Each of the first pad parts PP1 includes a plurality of gate pads GP respectively connected to the gate lines GL, a plurality of high-level voltage pads HP respectively connected to the high-level voltage lines PL, and a plurality of additional low-level voltage pads LP'. Each of the first pad parts PP1 is prepared in the display panel 210, namely, in third and fourth inactive areas of the first substrate 12 which are parallel.

Each of the gate pads GP is connected to a corresponding gate line GL through a corresponding gate link line among a plurality of gate link lines (not shown).

Each of the high-level voltage pads HP is formed between adjacent gate pads GP, and electrically connected to the high-level voltage lines PL. Therefore, each of the high-level voltage lines PL is formed between adjacent gate lines GL to be parallel to the respective gate lines GL, and receives the high-level voltage from a corresponding first flexible circuit film 220 through a corresponding high-level voltage pad HP.

The additional low-level voltage pads LP' are formed at both sides of the first pad part PP1 with a plurality of gate pads GP and high-level supply voltage pads HP therebetween. The additional low-level voltage pads LP' are electrically connected to the cathode electrode layer CE through an additional cathode connection part CCP' at certain intervals.

The additional cathode connection parts CCP' are electrically connected to a left edge portion and right edge portion of the cathode electrode layer CE to at certain intervals, and supply the low-level voltage, supplied from the respective first flexible circuit films 220 through the respective additional low-level voltage pads LP', to a left edge portion and right edge portion of the cathode electrode layer CE. To this end, each of the additional cathode connection parts CCP' includes a additional low-level voltage electrode LE' that partially overlaps the cathode electrode layer CE, and a additional cathode contact hole CH'. Except for the position, the additional low-level voltage electrode LE' is the same as the low-level voltage electrode LE and the additional cathode contact hole CH' is the same as the cathode contact hole CH, and thus, the above description is applied to the additional low-level voltage electrode LE' and the additional cathode contact hole CH'.

Each of the first flexible circuit films 220 is adhered to the first pad part PP1. The first flexible circuit films 220 supply the high-level voltage to both sides of the high-level voltage line PL through the first pad part PP1, and simultaneously supplies the low-level voltage to a corresponding additional low-level voltage pad LP'. To this end, a plurality of high-level voltage supply lines 222 electrically connected to the high-level voltage pad HP of the first pad part PP1 and a plurality of low-level voltage supply line 224 electrically connected to the respective additional low-level voltage pads LP' are formed in the first flexible circuit films 220, respectively. Each of the first flexible circuit films 220 is formed as a TCP or a COF, and adhered to the first pad part PP1, formed in each of the third and fourth inactive areas of the display panel 210, by the TAB process.

The first flexible circuit films 220 supply the external high-level voltage to both ends of the high-level voltage line PL, thereby minimizing the drop of the high-level voltage caused by the line resistance of the high-level voltage line PL. Furthermore, the first flexible circuit films 220 additionally supply the external low-level voltage to a left edge portion and right edge portion of the cathode electrode layer CE, thus better maintaining the constant level of the low-level voltage supplied from the cathode electrode layer CE. That is, the low-level voltage is supplied to the left edge portion and right edge portion of the cathode electrode layer CE at certain intervals by the first flexible circuit films 220, and is simultaneously supplied to an upper edge portion and lower edge portion of the cathode electrode layer CE at certain intervals by the second flexible circuit films 240. Therefore, the organic light emitting display device according to the third embodiment of the present invention supplies the low-level voltage to the upper, lower, left, and right edge portions of the cathode electrode layer CE at certain intervals, thus better maintaining the constant level of the low-level voltage supplied from the cathode electrode layer CE.

The organic light emitting display device according to the third embodiment of the present invention further includes first and second PCBs 260 and 270.

The first PCB 260 is electrically connected to each of the first flexible circuit films 220 adhered to the respective first pad parts PP1 in the third and fourth inactive areas of the display panel 210, and supplies both the high-level voltage and the low-level voltage to the first flexible circuit films 220 simultaneously. To this end, a high-level voltage input line 262 connected to the high-level voltage supply line 222 formed in the first flexible circuit film 220 is formed in the first PCB 260, and moreover, a low-level voltage input line 264 connected to the low-level voltage supply line 224 formed in the first flexible circuit film 220 is formed in the first PCB 260.

The second PCB 270 is electrically connected to each of the second flexible circuit films 240 adhered to the respective second pad parts PP2 in the first and second inactive areas of the display panel 210, and supplies the low-level voltage to the second flexible circuit films 240. To this end, a low-level voltage input line 272 connected to the low-level voltage supply line 242 formed in the second flexible circuit film 240 is formed in the first PCB 270.

The second PCB 270 supplies the external digital input data, the data control signal, and the reference gamma voltages to each of the first driving ICs 230.

The organic light emitting display device according to the third embodiment of the present invention provides the same effects as those of the organic light emitting display device according to the second embodiment of the present invention, and moreover can better maintain the constant level of the low-level voltage supplied to the cathode electrode layer CE.

Figure 9:
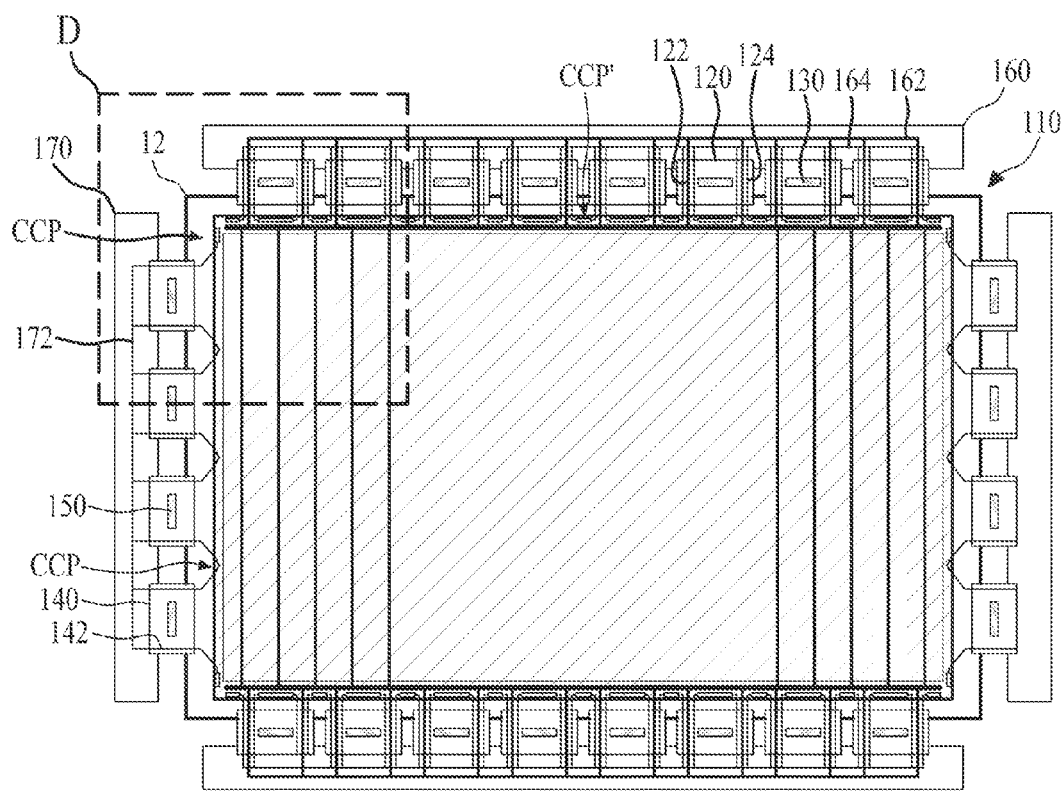
FIG. 9 is a perspective view schematically illustrating an organic light emitting display device according to a fourth embodiment of the present invention.
Figure 10:
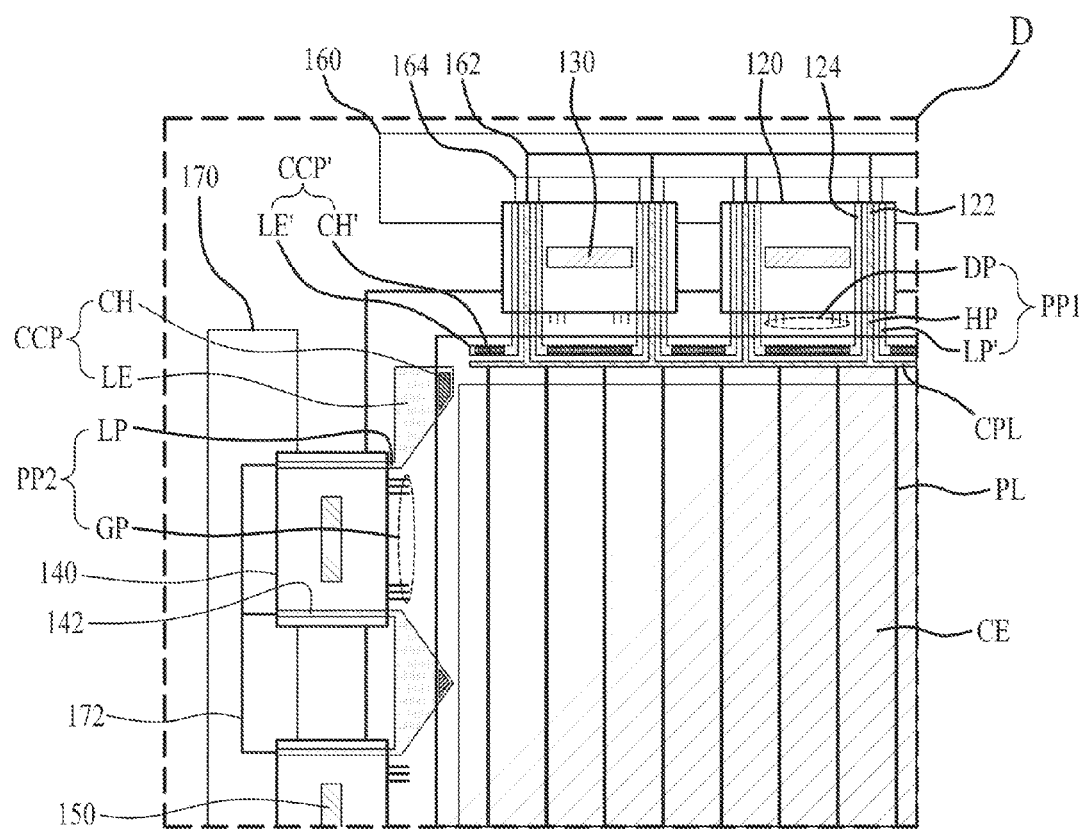
FIG. 10 is an enlarged view of a portion D of FIG. 9.

FIG. 9 is a perspective view schematically illustrating an organic light emitting display device according to a fourth embodiment of the present invention. FIG. 10 is an enlarged view of a portion D of FIG. 9. The display device of FIG. 9 is substantially similar to the display devices of FIGS. 3, 5 and 6, but now includes cathode connections at the top and bottom of the cathode electrode layer CE for supplying the low-level power to the cathode electrode layer CE.

Referring to FIGS. 9 to 10, the organic light emitting display device according to the fourth embodiment of the present invention includes a display panel 110, a plurality of first flexible circuit films 120, a plurality of first driving ICs 130, a plurality of second flexible circuit films 140, and a plurality of second driving ICs 150. Except for the first pad parts PP1 and the first flexible circuit films 120 prepared in the display panel 110, the other elements of the organic light emitting display device according to the fourth embodiment of the present invention are the same as the organic light emitting display device according to the first embodiment of the present invention, and thus, the above description is applied to the same elements.

Each of the first pad parts PP1 includes a plurality of gate pads GP respectively connected to the data lines DL, a plurality of high-level voltage pads HP respectively connected to the high-level voltage lines PL, and a plurality of additional low-level voltage pads LP'. Each of the first pad parts PP1 is prepared in the display panel 110, namely, first and second inactive areas of the first substrate 12 which are parallel.

Each of the data pads DP is connected to a corresponding data line DL through a corresponding data link line among a plurality of data link lines (not shown).

The high-level voltage pads HP are formed with a plurality of data pads DP therebetween, and electrically connected to the respective high-level voltage lines PL that is in common connected to the high-level voltage lines PL. Therefore, each of the high-level voltage lines PL is formed to be adjacent to and parallel to the respective gate lines GL, and receives the high-level voltage from a corresponding first flexible circuit film 120 through a common high-level voltage CPL and a corresponding high-level voltage pad HP.

The additional low-level voltage pads LP' are formed with the high-level voltage pads HP therebetween, respectively. The additional low-level voltage pads LP' are electrically connected to the upper edge portion and lower edge portion of the cathode electrode layer CE through an additional cathode connection part CCP' at certain intervals.

The additional cathode connection parts CCP' are electrically connected to an upper edge portion and lower edge portion of the cathode electrode layer CE, and are formed at both sides of the high-level voltage pads HP to have a certain interval. Therefore, some of the additional cathode connection parts CCP' may be formed between adjacent high-level voltage pads HP depending on a disposed position, respectively. In this case, each of the additional cathode connection parts CCP' is in common connected to two additional low-level voltage pads LP' that are formed with a plurality of high-level voltage pads HP therebetween. In other words, there are several sets of additional cathode connection parts CCP' at different locations around on the cathode electrode layer CE. A first set of the additional cathode connection parts CCP' is located in spaces between adjacent first flexible circuit films 120. A second set of the additional cathode connection parts CCP' is located between the first set of additional cathode connection parts CCP'. In FIG. 10, these are the additional cathode connection parts CCP' located directly below the first flexible circuit films 120. A third set of the additional cathode connection parts CCP' is located in the corner regions of the cathode electrode layer CE.

The additional cathode connection parts CCP' supply the low-level voltage, supplied from the respective first flexible circuit films 220 through the respective additional low-level voltage pads LP', to the upper edge portion and lower edge portion of the cathode electrode layer CE. To this end, each of the additional cathode connection parts CCP' includes a additional low-level voltage electrode LE' that partially overlaps the cathode electrode layer CE, and a additional cathode contact hole CH'. Except for their position, the additional low-level voltage electrode LE' is the same as the low-level voltage electrode LE and the additional cathode contact hole CH' is the same as the cathode contact hole CH, and thus, the above description is applied to the additional low-level voltage electrode LE' and the additional cathode contact hole CH'. Additionally, the additional cathode connection parts CCP' and the data lines may be located on different layers of the display panel 110 so that the additional cathode connection parts CCP' do not interfere with the routing of the data lines.

Each of the first flexible circuit films 120 is adhered to the first pad part PP1. The first flexible circuit films 120 supply the high-level voltage to both sides of the high-level voltage line PL through the first pad part PP1, and simultaneously supplies the low-level voltage to a corresponding additional low-level voltage pad LP'. To this end, a plurality of high-level voltage supply lines 122 electrically connected to the high-level voltage pad HP of the first pad part PP1 and a plurality of low-level voltage supply line 124 electrically connected to the respective additional low-level voltage pads LP' are formed in the first flexible circuit films 120, respectively. Each of the first flexible circuit films 120 is formed as a TCP or a COF, and adhered to the first pad part PP1, formed in each of the first and second inactive areas of the display panel 110, by the TAB process. The first flexible circuit films 120 supply the external high-level voltage to both sides of the high-level voltage line PL, thereby minimizing the drop of the high-level voltage caused by the line resistance of the high-level voltage line PL.

Furthermore, the first flexible circuit films 120 additionally supply the external low-level voltage to a left edge portion and right edge portion of the cathode electrode layer CE, thus better maintaining the constant level of the low-level voltage supplied from the cathode electrode layer CE. That is, the low-level voltage is supplied to the left edge portion and right edge portion of the cathode electrode layer CE at certain intervals by the first flexible circuit films 120, and simultaneously supplied to an upper edge portion and lower edge portion of the cathode electrode layer CE at certain intervals by the second flexible circuit films 140. Therefore, the organic light emitting display device according to the third embodiment of the present invention supplies the low-level voltage to the upper, lower, left, and right edge portions of the cathode electrode layer CE at certain intervals, thus better maintaining the constant level of the low-level voltage supplied from the cathode electrode layer CE.

The organic light emitting display device according to the fourth embodiment of the present invention further includes first and second PCBs 160 and 170.

The first PCB 160 is electrically connected to each of the first flexible circuit films 120 adhered to the respective first pad parts PP1 in the first and second inactive areas of the display panel 110, and supplies both the high-level voltage and the low-level voltage to the first flexible circuit films 120 simultaneously. To this end, a high-level voltage input line 162 connected to the high-level voltage supply line 122 formed in the first flexible circuit film 120 is formed in the first PCB 160, and moreover, a low-level voltage input line 164 connected to the low-level voltage supply line 124 formed in the first flexible circuit film 120 is formed in the first PCB 160.

The first PCB 160 supplies the external digital input data, the data control signal, and the reference gamma voltages to each of the first driving ICs 130.

The second PCB 170 is electrically connected to each of the second flexible circuit films 140 adhered to the respective second pad parts PP2 in the third and fourth inactive areas of the display panel 110, and supplies the low-level voltage to the second flexible circuit films 140. To this end, a low-level voltage input line 172 connected to the low-level voltage supply line 142 formed in the second flexible circuit film 140 is formed in the first PCB 170.

The organic light emitting display device according to the fourth embodiment of the present invention provides the same effects as those of the organic light emitting display device according to the first embodiment of the present invention, and moreover can better maintain the constant level of the low-level voltage supplied to the cathode electrode layer CE.

Figure 11:
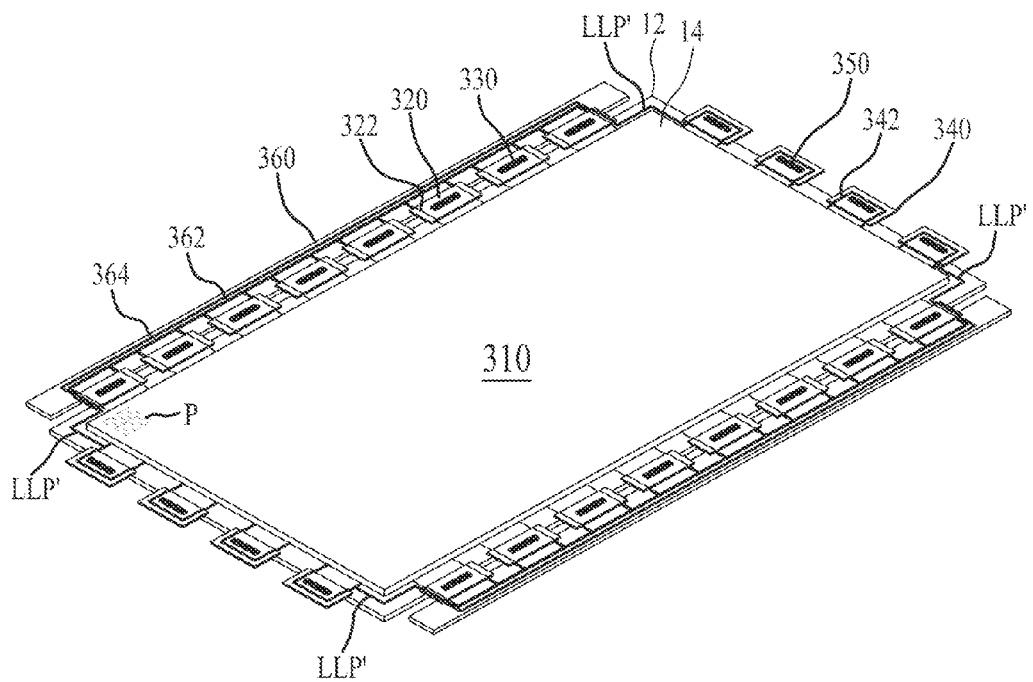
FIG. 11 is a perspective view schematically illustrating an organic light emitting display device according to a fifth embodiment of the present invention.
Figure 12:
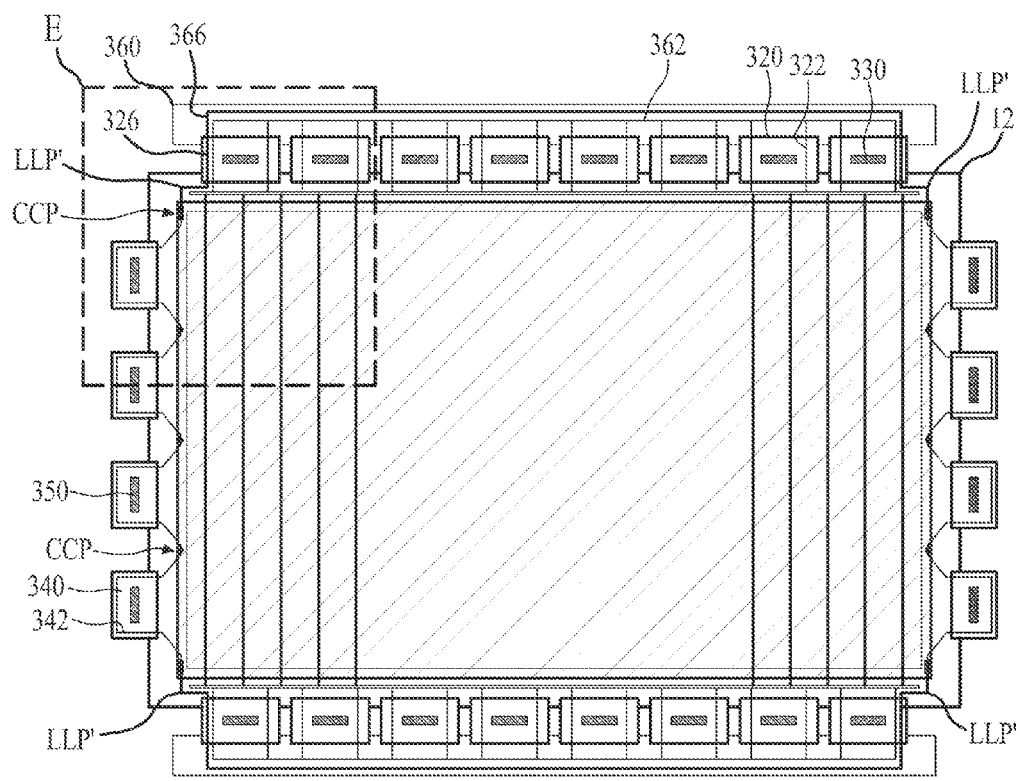
FIG. 12 is a plan view schematically illustrating the organic light emitting display device according to the fifth embodiment of the present invention.
Figure 13:
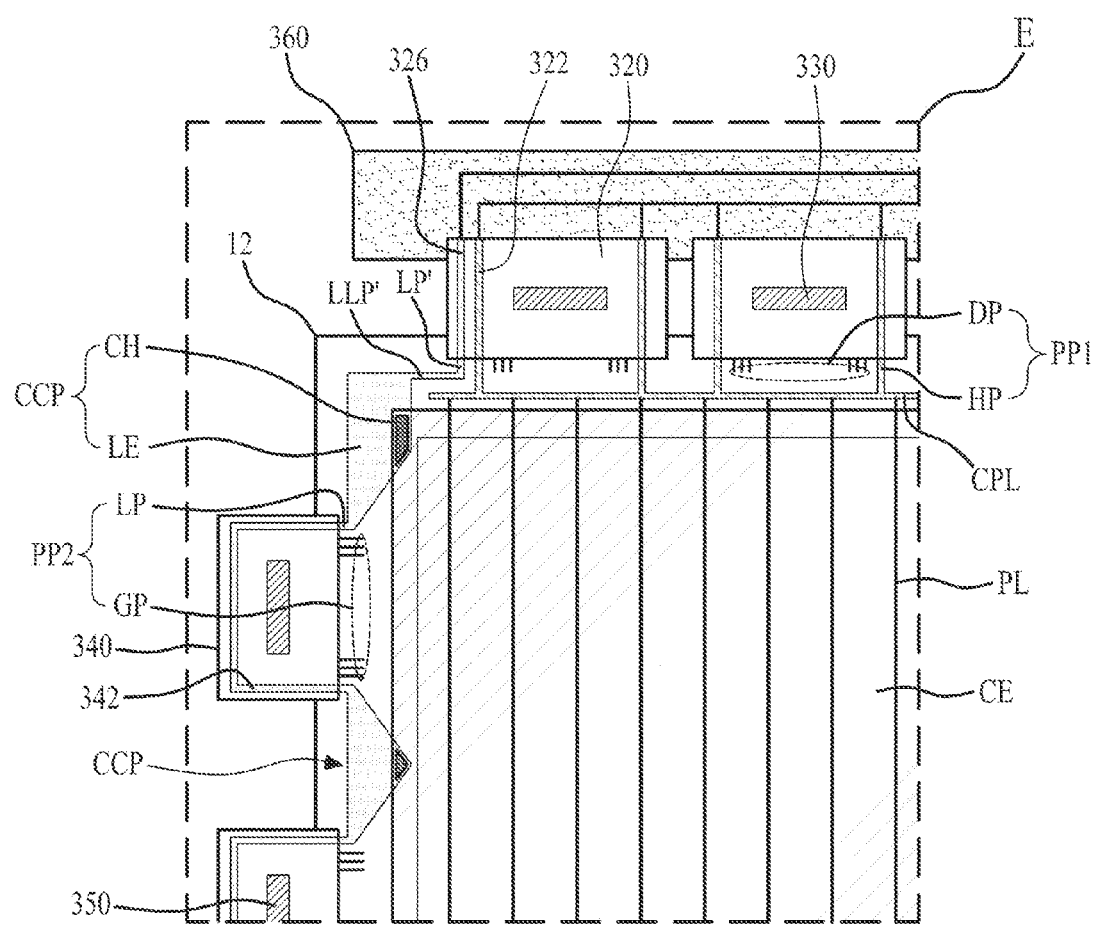
FIG. 13 is an enlarged view of a portion E of FIG. 12.

FIG. 11 is a perspective view schematically illustrating an organic light emitting display device according to a fifth embodiment of the present invention. FIG. 12 is a plan view schematically illustrating the organic light emitting display device according to the fifth embodiment of the present invention. FIG. 13 is an enlarged view of a portion E of FIG. 12.

Referring to FIGS. 11 to 13, the organic light emitting display device according to the fifth embodiment of the present invention includes a display panel 310, a plurality of first flexible circuit films 320, a plurality of first driving ICs 330, a plurality of second flexible circuit films 340, and a plurality of second driving ICs 350. The organic light emitting display device according to the fifth embodiment of the present invention is manufactured by removing the second PCB 170 from the organic light emitting display device according to the first embodiment of the present invention. Hereinafter, only different elements will be described.

The display panel 310 is configured identically to the display panel 110 of the organic light emitting display device according to the first embodiment of the present invention, but each of a first-position first pad part PP1 and a last-position first pad part PP1 (which are disposed at both sides) among a plurality of first pad parts PP1 further includes a additional low-level voltage pad LP'. The first-position first pad part PP1 is formed in the left area of each of the first and second inactive areas corresponding to the first data line, and the last-position first pad part PP1 is formed in the right area of each of the first and second inactive areas corresponding to the last data line.

The additional low-level voltage pad LP' formed in the first inactive area of the display panel 310 is connected to a low-level voltage pad LP of a first-position second pad part PP2 among a plurality of second pad parts PP2 through a additional low-level voltage link line LLP', or connected to a low-level voltage electrode LE of a cathode connection layer CCP connected to a low-level voltage pad LP of the first-position second pad part PP2. In this case, the first-position second pad part PP2 is formed in an upper area of each of the third and fourth inactive areas corresponding to the first gate line.

The additional low-level voltage pad LP' formed in the second inactive area of the display panel 310 is connected to a low-level voltage pad LP of a last-position second pad part PP2 among the plurality of second pad parts PP2 through a additional low-level voltage link line LLP', or connected to a low-level voltage electrode LE of a cathode connection layer CCP connected to a low-level voltage pad LP of the last-position second pad part PP2. In this case, the last position second pad part PP2 is formed in a lower area of each of the third and fourth inactive areas corresponding to the first gate line.

The first flexible circuit films 320 are formed identically to the first flexible circuit films 120 of the organic light emitting display device according to the first embodiment of the present invention. However, a first-position first flexible circuit film 320 adhered to the first-position first pad part PP1 among the plurality of first flexible circuit films 320 further includes a additional low-level voltage supply line 326 for transferring the low-level voltage to the additional low-level voltage pad LP', and a last-position first flexible circuit film 320 adhered to the last-position first pad part PP1 among the plurality of first flexible circuit films 320 further includes a additional low-level voltage supply line 326 for transferring the low-level voltage to the additional low-level voltage pad LP'.

The first driving ICs 330 are respectively mounted on the first flexible circuit films 320, and drive the respective pixel circuits PC, namely, to supply data signals to the respective data lines DL. The first driving ICs 330 are configured identically to the first driving ICs 130 of the organic light emitting display device according to the first embodiment of the present invention.

Each of the second flexible circuit films 340 is adhered to the second pad part PP2, receives the low-level voltage through the additional low-level voltage pad LP' and the additional low-level voltage link line LLP', and supplies the low-level voltage to a low-level voltage electrode LE of a plurality of cathode connection parts CCP through the second pad part PP2. To this end, a plurality of low-level voltage supply lines 342 electrically connected to the low-level voltage pad LP of the second pad part PP2 are formed in each of the second flexible circuit films 340.

Each of the low-level voltage supply lines 342 is formed at both sides of a corresponding second flexible circuit film 340, for example, upper and lower edge portions of the corresponding flexible circuit film 340, and connects a plurality of low-level voltage pads formed at both sides of the second pad part PP2. That is, a plurality of low-level voltage supply lines 142 formed in a first-position second flexible circuit film 340 among the second flexible circuit films 340 supplies the low-level voltage, supplied from the additional low-level voltage link line LLP', to a second-position second flexible circuit film 340 through a cathode electrode CCP formed between the first-position second flexible circuit film 340 and the second-position second flexible circuit film 340. Therefore, the low-level voltage supplied to the additional low-level voltage link line LLP' is dependently transferred to a plurality of cathode connection parts CCP through the low-level voltage supply line 342 of each of the second flexible circuit films 340.

The second driving ICs 350 are respectively mounted on the second flexible circuit films 340, and drive the respective pixel circuits PC, namely, to generate the gate signal according to the gate control signal to sequentially supply the data signal to the gate lines GL. Except for a scheme of supplying the gate control signal supplied to the second driving ICs 350, the second driving ICs 350 are the same as the second driving ICs 150 of the organic light emitting display device according to the first embodiment of the present invention. That is, the second driving ICs 350, respectively mounted on the first-position second flexible circuit film 340 and the last-position second flexible circuit film 340, receive the gate control signal through the first-position first flexible circuit film 320 and the last-position first flexible circuit film 320, the first-position first pad part and the last-position first pad part, a plurality of gate control signal link lines (not shown) formed in respective corner areas of the first substrate 12, and the first-position second flexible circuit film 340 and the last-position second flexible circuit film 340, respectively. Each of the second driving ICs 350, respectively mounted on the second flexible circuit films 340 other than the first-position second flexible circuit film 340 and the last-position second flexible circuit film 340, receives the gate control signal from a previous flexible circuit film 340 through a gate control signal transfer line (not shown) formed between adjacent second pad parts PP2.

A first PCB 360 is electrically connected to each of the first flexible circuit films 320 adhered to the respective first pad parts PP1 in the first and second inactive areas of the display panel 310, supplies the high-level voltage to the first flexible circuit films 320, and supplies the low-level voltage to the first-position first flexible circuit film 320 and the last-position first flexible circuit film 320. To this end, a high-level voltage input line 362 connected to the high-level voltage supply line 322 formed in the first flexible circuit film 320 is formed in the first PCB 360, and moreover, a low-level voltage input line 366 connected to the additional low-level voltage supply line 326 of each of the first-position first flexible circuit film 320 and the last-position first flexible circuit film 320 is formed in the first PCB 360.

The organic light emitting display device according to the fifth embodiment of the present invention provides the same effects as those of the organic light emitting display device according to the first embodiment of the present invention, and moreover, the second PCB 170 of the organic light emitting display device according to the first embodiment of the present invention may be removed.

The second PCB 170 or 270 may also be removed from each of the organic light emitting display devices according to the second to fourth embodiment of the present invention by the same scheme as that of the organic light emitting display device according to the fifth embodiment of the present invention.

When the first PCB 260 is removed from the organic light emitting display device according to the second embodiment of the present invention illustrated in FIGS. 5 and 6, the second PCB 270 is connected to the plurality of second flexible circuit films 240, supplies the low-level voltage to the plurality of second flexible circuit films 240, and supplies the high-level voltage to the first flexible circuit films 220 through some of the second flexible circuit films 240 and the first substrate 12 of the display panel 110.

When the first PCB 260 is removed from the organic light emitting display device according to the third embodiment of the present invention illustrated in FIGS. 7 and 8, the second PCB 270 is connected to the plurality of second flexible circuit films 240, supplies the low-level voltage to the plurality of second flexible circuit films 240, and supplies both the high-level voltage and the low-level voltage to the first flexible circuit films 220 through some of the second flexible circuit films 240 and the first substrate 12 of the display panel 110.

When the second PCB 170 is removed from the organic light emitting display device according to the third embodiment of the present invention illustrated in FIGS. 9 and 10, the first PCB 160 is connected to the plurality of first flexible circuit films 120, supplies the high-level voltage and the low-level voltage to the plurality of first flexible circuit films 120, and supplies the low-level voltage to the second flexible circuit films 140 through some of the first flexible circuit films 120 and the first substrate 12 of the display panel 110.

As described above, the organic light emitting display device according to the present invention supplies the high-level voltage to both sides of the high-level voltage line connected to each pixel through the flexible circuit film with the driving IC mounted thereon, and supplies the low-level voltage to the plurality of areas of the cathode electrode layer connected to each pixel, thus facilitating the supply of the high-level voltage and low-level voltage and minimizing non-uniform luminance due to the drop of a voltage caused by the resistance of the high-level voltage line.

Throughout the specification, various elements have been described with the labels of "first" and "second" and the like for ease of description only and this numbering is not intended to be limiting on the scope of the claims. It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display device, comprising:
   a display panel including:
      a plurality of pixel driving lines configured to carry pixel driving signals;
      a plurality of high-level voltage lines configured to carry a first voltage; and
      a plurality of pixels with each pixel having an emission cell that includes:
         an anode electrode connected to the pixel driving lines; and
         a cathode electrode layer to supply a second voltage to the pixels,
         wherein the plurality of pixels are connected to the high-level voltage lines and the pixel driving lines, and are configured to emit light based on the first voltage and the pixel driving signals;
   a plurality of first flexible circuit films on a first edge of the display panel;
   a plurality of low-level voltage supply lines on the first flexible circuit films;
   a plurality of first connection parts disposed in respective regions between each adjacent pair of first flexible circuit films, wherein the plurality of first connection parts are electrically connected between the cathode electrode layer and a first subset of the low-level voltage supply lines;
   a plurality of second connection parts respectively disposed between each adjacent pair of the first connection parts, wherein the plurality of second connection parts are electrically connected between the cathode electrode layer and a second subset of the low-level voltage supply lines, the plurality of first flexible circuit films to supply the second voltage to the cathode electrode layer through the low-level voltage supply lines and the first and second connection parts; and
   a plurality of second flexible circuit films on a second edge opposite the first edge of the display panel, the second flexible circuit films configured to supply the second voltage to the cathode electrode layer, wherein each of the first and second flexible circuit films is further configured to supply one or more of the pixel driving signals to the pixel driving lines.

2. The organic light emitting display device of claim 1, further comprising:
   a plurality of first driving integrated circuits (ICs) mounted on the first flexible circuit films and a plurality of second driving (ICs) mounted on the second flexible circuit films, the first and second driving ICs generating the pixel driving signals.

3. The organic light emitting display device of claim 1, wherein the pixel driving lines are data lines, the pixel driving signals are the data signals, and each of the first and second flexible circuit films is further configured to supply one or more of the data signals to the data lines.

4. The organic light emitting display device of claim 1, wherein the second voltage is lower than the first voltage.

5. The organic light emitting display device of claim 1, further comprising a corner region connection part located at a corner region of the cathode electrode layer, and one of the first circuit films is to supply the second voltage to the cathode electrode layer via the corner region connection part.

6. The organic light emitting display device of claim 5, wherein the second connection parts and the pixel driving lines are located on different layers of the display panel.

7. The organic light emitting display device of claim 1, further comprising:
   a plurality of third flexible circuit films located along a third edge of the display panel; and
   a plurality of fourth flexible circuit films located along a fourth edge opposite the third edge of the display panel, wherein the third edge and fourth edges are different than the first and second edges, and the third and fourth flexible circuit films are to supply the second voltage to the cathode electrode layer and gate signals to the pixel driving lines.

8. The organic light emitting display device of claim 7, further comprising:
   a first printed circuit board (PCB) coupled to the first flexible circuit films, the first PCB configured to supply the first voltage and the second voltage to the first flexible circuit films; and
   a second PCB coupled to the third flexible circuit films, the second PCB configured to supply the second voltage to the third flexible circuit films.

9. The organic light emitting display device of claim 7, further comprising:
   a PCB coupled to the first flexible circuit films, the PCB to supply the first voltage and the second voltage to the first flexible circuit films, and to supply the second voltage to the third flexible circuit films via at least one of the first flexible circuit films.

10. An organic light emitting display device, comprising:
    a display panel comprising a plurality of high-level voltage lines, a cathode electrode layer receiving a low-level voltage, and a plurality of pixels with each pixel comprising a pixel circuit connected to a gate line, a data line, a respective one of the high-level voltage lines, and an emission cell, the emission cell formed between an anode electrode connected to the pixel circuit and the cathode electrode layer;
    a plurality of first flexible circuit films having first low voltage supply lines and high voltage supply lines, the high voltage supply lines connected to the high-level voltage lines through first pad parts on the display panel, and the first flexible circuit films supplying a high-level voltage to the high-level voltage lines through the first pad parts;
    a plurality of first connection parts disposed in respective regions between each adjacent pair of the first flexible circuit films, wherein the plurality of first connection parts are electrically connected between the cathode electrode layer and a first subset of the first low voltage supply lines;
    a plurality of second connection parts respectively disposed between each adjacent pair of first connection parts, wherein the plurality of second connection parts are electrically connected between the cathode electrode layer and a second subset of the first low voltage supply lines, the plurality of first flexible circuit films to supply the second voltage to the cathode electrode layer through the first low voltage supply lines and the first and second connection parts;
    a plurality of second flexible circuit films having second low voltage supply lines connected to third connection parts of the display panel connected to the cathode electrode layer, the plurality of second flexible circuit films supplying the low-level voltage to the cathode electrode layer through the third connection parts,
    wherein each of the first and second flexible circuit films is further configured to provide one or more of pixel driving signals to the pixels.

11. The organic light emitting display device of claim 10, further comprising:

a plurality of first driving integrated circuits (ICs) mounted on the first flexible circuit films connected to the data lines; and a plurality of second driving (ICs) mounted on the second flexible circuit films connected to the gate lines, wherein the first and second driving ICs are configured to generate the pixel driving signals.

12. The organic light emitting display device of claim 10, wherein each of the first connection parts comprise:

a low-level voltage electrode connected to corresponding first low voltage supply lines, the low-level voltage electrode configured to overlap an edge portion of the cathode electrode layer; and a cathode contact hole electrically configured to connect between the edge portion of the cathode electrode layer and the low-level voltage electrode.

13. The organic light emitting display device of claim 10, further comprising a corner region connection part located at a corner region of the cathode electrode layer.

14. The organic light emitting display device of claim 10, wherein the third connection parts are located in a region between each adjacent pair of second flexible circuit films.

15. The organic light emitting display device of claim 10, wherein the first flexible circuit films are located along a first edge of the display panel.

16. The organic light emitting display device of claim 15, further comprising:

third flexible circuit films located along a second edge opposite the first edge of the display panel that is opposite from the first edge, wherein the third flexible circuit films are configured to supply the low-level voltage to the cathode layer via fourth connection parts.

17. The organic light emitting display device of claim 1, wherein the plurality of first flexible circuit films are to supply the first voltage to the high-level voltage lines.

18. The organic light emitting display device of claim 17, further comprising:

a plurality of high-level voltage supply lines on the first flexible circuit films;

a plurality of pad parts on the display panel, the pad parts electrically connected to the high-level voltage supply lines and the high-level voltage lines such that the first voltage is supplied to the high-level voltage lines through the high-level voltage supply lines and the pad parts.

19. The organic light emitting display device of claim 18, wherein four low-level voltage supply lines and two high-level voltage supply lines are disposed on each of the first flexible circuit films.

20. The organic light emitting display device of claim 7, further comprising a plurality of third connection parts electrically connected to the cathode electrode layer, the third circuit films configured to supply the second voltage to the cathode electrode layer through the third connection parts.

21. The organic light emitting display device of claim 20, wherein the first and second connection parts have a rectangular shape and the third connection parts have a triangular shape.

22. The organic light emitting display device of claim 1, wherein each first connection part electrically connects the cathode electrode layer and a respective pair of the flexible circuit films, and wherein each second connection part electrically connects the cathode electrode layer and a single respective one of the first flexible circuit films.

* * * * *